(12) United States Patent
Welch et al.

(10) Patent No.: US 6,971,160 B1
(45) Date of Patent: Dec. 6, 2005

(54) HYBRID ELECTRICAL CIRCUIT METHOD WITH MATED SUBSTRATE CARRIER METHOD

(75) Inventors: Ryan J. Welch, Bellbrook, OH (US); Tony K. Quach, Lebanon, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 183 days.

(21) Appl. No.: 10/034,769

(22) Filed: Jan. 3, 2002

(51) Int. Cl.$^7$ .............................. H01K 3/30
(52) U.S. Cl. ........................ 29/832; 29/846; 29/847; 29/852; 29/833; 29/834; 29/740; 257/315; 257/316; 438/201
(58) Field of Search .................... 29/840–842, 832, 29/825, 827, 592, 854; 174/52.4; 228/107; 257/676, 666, 315; 361/811; 700/2, 97; 438/201, 438/211

(56) References Cited

U.S. PATENT DOCUMENTS

| | | | |
|---|---|---|---|
| 3,848,078 A | 11/1974 | Guillot, Jr. | |
| 4,547,755 A | 10/1985 | Roberts | |
| 4,951,014 A | 8/1990 | Wohlert et al. | |
| 5,023,994 A | 6/1991 | Bujatti et al. | |
| 5,291,372 A | 3/1994 | Matsumoto | |
| 5,638,599 A * | 6/1997 | Beratan et al. | 29/854 |
| 5,783,857 A | 7/1998 | Ziegner et al. | |
| 6,049,977 A * | 4/2000 | Atkins et al. | 29/843 |
| 6,131,277 A | 10/2000 | Cadenhead et al. | |
| 6,137,163 A | 10/2000 | Kim et al. | |
| 6,807,727 B2 * | 10/2004 | Bolotin | 29/740 |
| 2002/0050611 A1 * | 5/2002 | Yitzchaik et al. | 257/315 |

* cited by examiner

Primary Examiner—Minh Trinh
(74) Attorney, Agent, or Firm—AFMCLO/JAZ; Gerald B. Hollins

(57) ABSTRACT

A hybrid integrated circuit fabrication method in which an insulating substrate member and its metallic substrate carrier are made to be mating with precision through use of computer controlled machining performed on each member. A combination of disclosed specifically tailored software and commercially available software are used in the method to generate code for controlling a precision milling machine during the fabrication of substrate and substrate carrier members. The method for precision mating of substrate and substrate carrier enable disposition of a precision recess in the substrate carrier and the location of recess pillars and pedestals (the latter being for integrated circuit die mounting use) at any carrier recess location desirable for electrical, thermal or physical strength reasons. Enhanced electrical thermal and physical properties are achieved in hybrid devices fabricated according to the method especially when compared with devices and methods having the limited availability of comparable elements afforded by previous hybrid fabrication arrangements.

13 Claims, 17 Drawing Sheets

A - Top View

B - Front View Motor Up

C - Side View Motor Up

D - Side View Motor Down

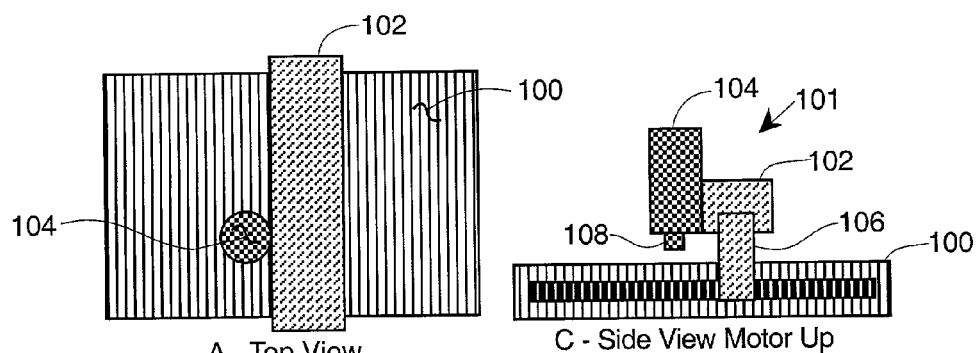
Fig. 1A — A - Top View
Fig. 1B — C - Side View Motor Up
Fig. 1C — B - Front View Motor Up
Fig. 1D — D - Side View Motor Down
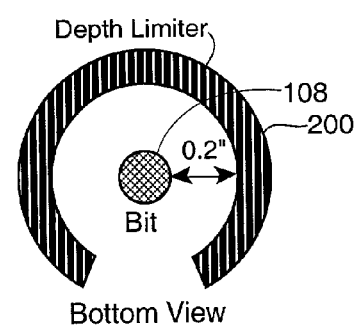
Fig. 2A — Bottom View
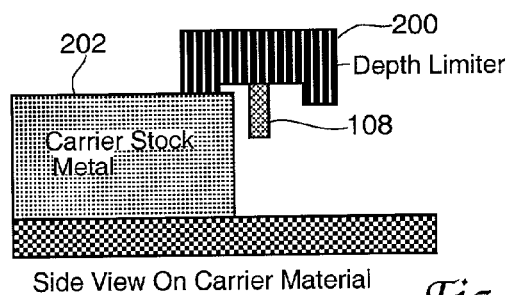
Fig. 2B — Side View On Carrier Material
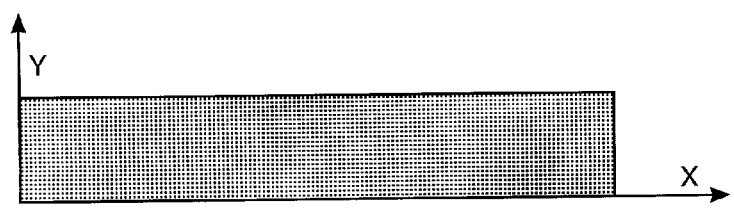
Fig. 3

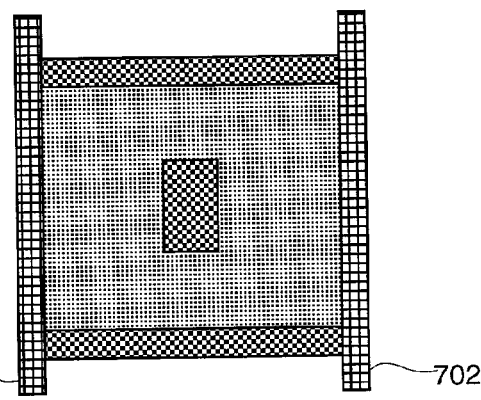
Fig. 7  700  702
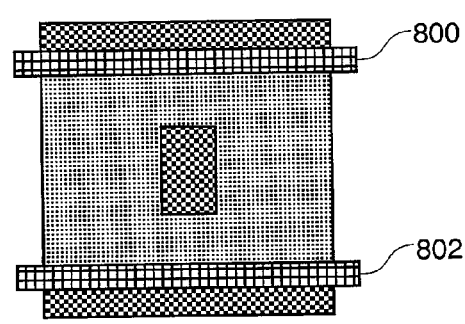
Fig. 8A  New Boxes
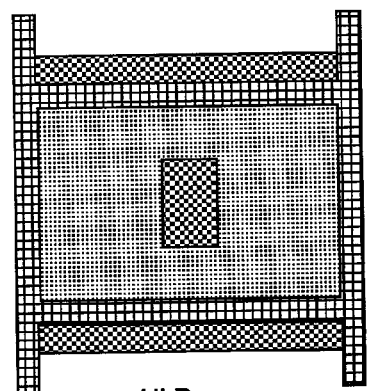
Fig. 8B  All Boxes
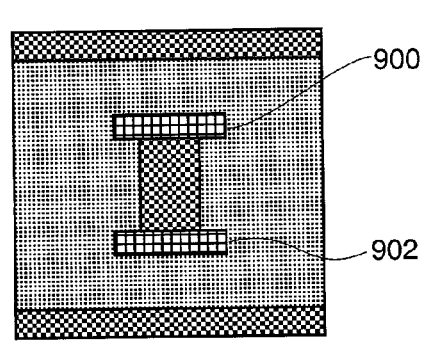
Fig. 9A  New Boxes
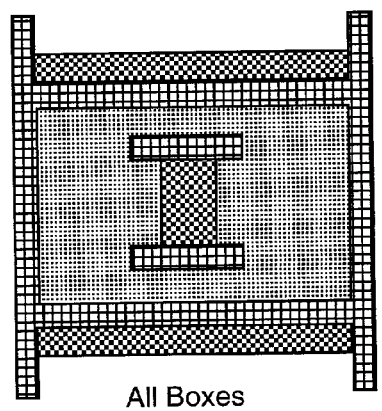
Fig. 9B  All Boxes Processing Boxes 1          Completed Boxes
Xmin    0                   Xmin
Ymin    −360.5              Ymin
Xmax    unknown             Xmax
Ymax    360.5               Ymax New Box

| Processing Boxes | 1 | 2 |
|---|---|---|
| Xmin | 403 | 403 |
| Ymin | 164.5 | -360.5 |
| Xmax | unknown | unknown |
| Ymax | 360.5 | -164.5 |

All Boxes

| Completed Boxes | 1 |
|---|---|
| Xmin | 0 |
| Ymin | -360.5 |
| Xmax | 363.5 |
| Ymax | 360.5 |

New Boxes

Processing Boxes 1
- Xmin 636.5
- Ymin -360.5
- Xmax unknown
- Ymax 360.5

All Boxes

| Completed Boxes | 1 | 2 | 3 |
|---|---|---|---|
| Xmin | 0 | 403 | 403 |
| Ymin | -360.5 | 164.5 | -360.5 |
| Xmax | 363.5 | 597 | 597 |
| Ymax | 360.5 | 360.5 | -164.5 |

New Boxes

Processing Boxes
- Xmin
- Ymin
- Xmax
- Ymax

All Boxes

| Completed Boxes | 1 | 2 | 3 | 4 |
|---|---|---|---|---|
| Xmin | 0 | 403 | 403 | 636.5 |
| Ymin | -360.5 | 164.5 | -360.5 | -360.5 |
| Xmax | 363.5 | 597 | 597 | 1000 |
| Ymax | 360.5 | 360.5 | -164.5 | 360.5 |

Original Carrier Layout

Cut Defined From Basic Algorithm

New Box

Processing Boxes  1      2
         Xmin   403    403
         Ymin   96.5  -360.5
         Xmax
         Ymax   360.5 -108.5

All Boxes

Completed Boxes 1
         Xmin   0
         Ymin  -360.5
         Xmax   363.5
         Ymax   360.5

New Box

Processing Boxes  1      2
         Xmin   403
         Ymin  -360.5
         Xmax
         Ymax  -108.5

All Boxes

Completed Boxes 1       2
         Xmin   0       403
         Ymin  -360.5   96.5
         Xmax   363.5   597
         Ymax   360.5   360.5

New Box

Processing Boxes
Xmin
Ymin
Xmax
Ymax

All Boxes

| Completed Boxes | 1 | 2 | 3 |
|---|---|---|---|
| Xmin | 0 | 403 | 403 |
| Ymin | -360.5 | 96.5 | -360.5 |
| Xmax | 363.5 | 597 | 598.5 |
| Ymax | 360.5 | 360.5 | -108.5 |

New Box

Processing Boxes
Xmin
Ymin
Xmax
Ymax

All Boxes

Completed Boxes  1      2      3      4
Xmin    0     403    403    620.5
Ymin   -360.5  96.5  -360.5 -131.5
Xmax   363.5  597   598.5  620.5
Ymax   360.5  360.5 -108.5 -108.5

New Box

Processing Boxes  1      2
Xmin    636.5  638
Ymin   -131.5 -360.5
Xmax
Ymax    360.5 -298.5

All Boxes

Completed Boxes  1      2      3      4
Xmin    0     403    403    620.5
Ymin   -360.5  96.5  -360.5 -131.5
Xmax   363.5  597   598.5  620.5
Ymax   360.5  360.5 -108.5 -108.5

New Box

Processing Boxes 1
Xmin 638
Ymin -360.5
Xmax
Ymax -298.5

All Boxes

| Completed Boxes | 1 | 2 | 3 | 4 | 5 |
|---|---|---|---|---|---|
| Xmin | 0 | 403 | 403 | 620.5 | 636.5 |
| Ymin | -360.5 | 96.5 | -360.5 | -131.5 | -131.5 |
| Xmax | 363.5 | 597 | 598.5 | 620.5 | 747 |
| Ymax | 360.5 | 360.5 | -108.5 | -108.5 | 360.5 |

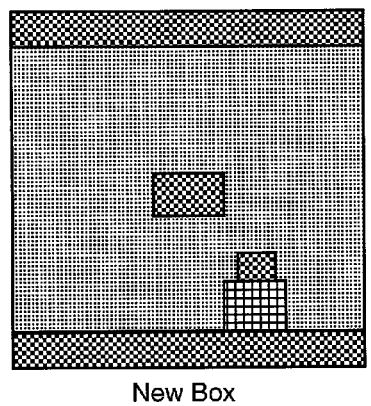
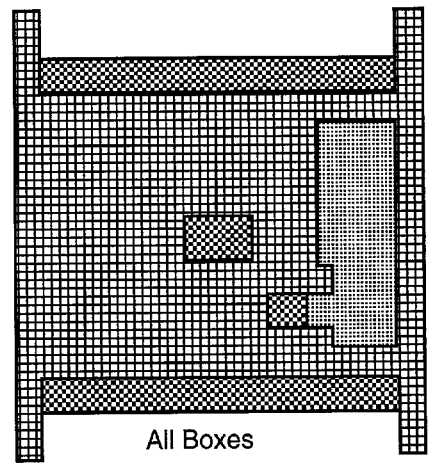
New Box      All Boxes
| Processing Boxes | Completed Boxes | 1 | 2 | 3 | 4 | 5 | 6 |
|---|---|---|---|---|---|---|---|
| Xmin | Xmin | 0 | 403 | 403 | 620.5 | 636.5 | 638 |
| Ymin | Ymin | -360.5 | 96.5 | -360.5 | -131.5 | -131.5 | -360.5 |
| Xmax | Xmax | 363.5 | 597 | 598.5 | 620.5 | 747 | 747 |
| Ymax | Ymax | 360.5 | 360.5 | -108.5 | -108.5 | 360.5 | -131.5 |
*Fig. 24A*      *Fig. 24B*
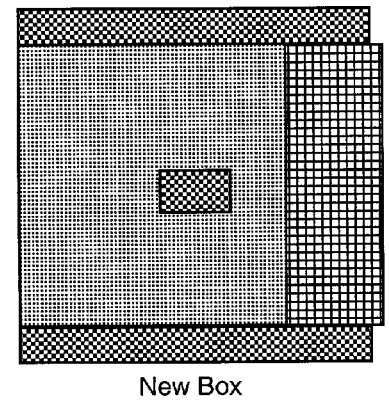
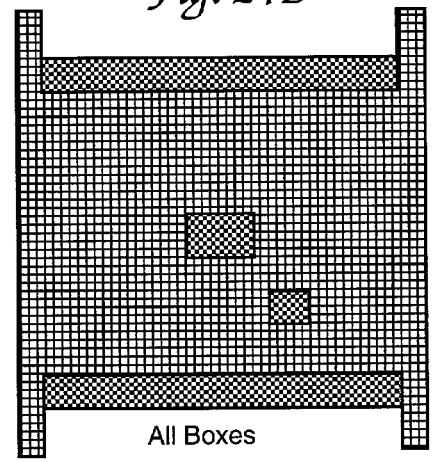
New Box      All Boxes
| Processing Boxes | Completed Boxes | 1 | 2 | 3 | 4 | 5 | 6 | 7 |
|---|---|---|---|---|---|---|---|---|
| Xmin | Xmin | 0 | 403 | 403 | 620.5 | 636.5 | 636.5 | 786.5 |
| Ymin | Ymin | -360.5 | 96.5 | -360.5 | -131.5 | -131.5 | -360.5 | -360.5 |
| Xmax | Xmax | 363.5 | 597 | 598.5 | 620.5 | 747 | 747 | 1000 |
| Ymax | Ymax | 360.5 | 360.5 | -108.5 | -108.5 | 360.5 | -131.5 | 360.5 |
*Fig. 25A*      *Fig. 25B*

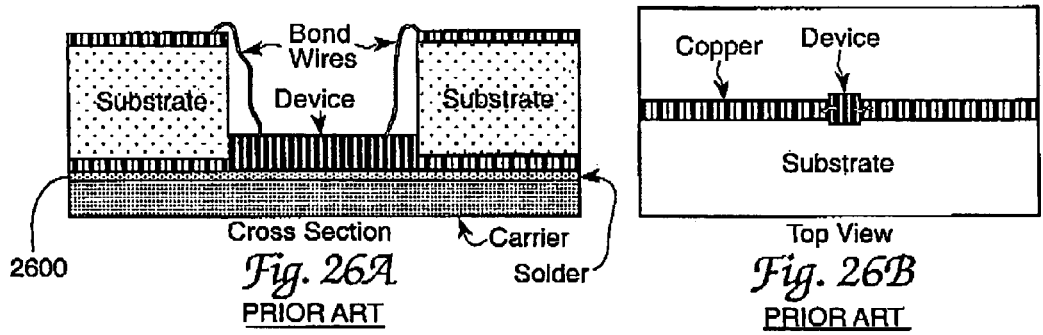
Fig. 26A PRIOR ART
Fig. 26B PRIOR ART
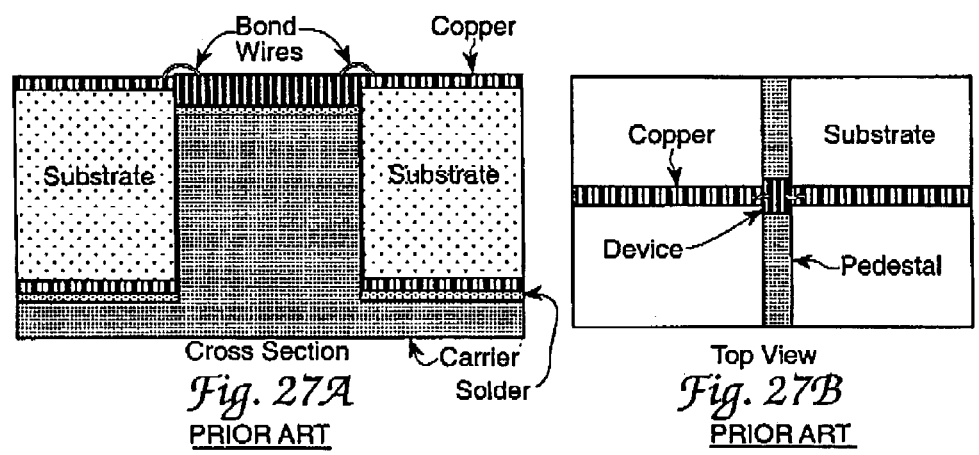
Fig. 27A PRIOR ART
Fig. 27B PRIOR ART
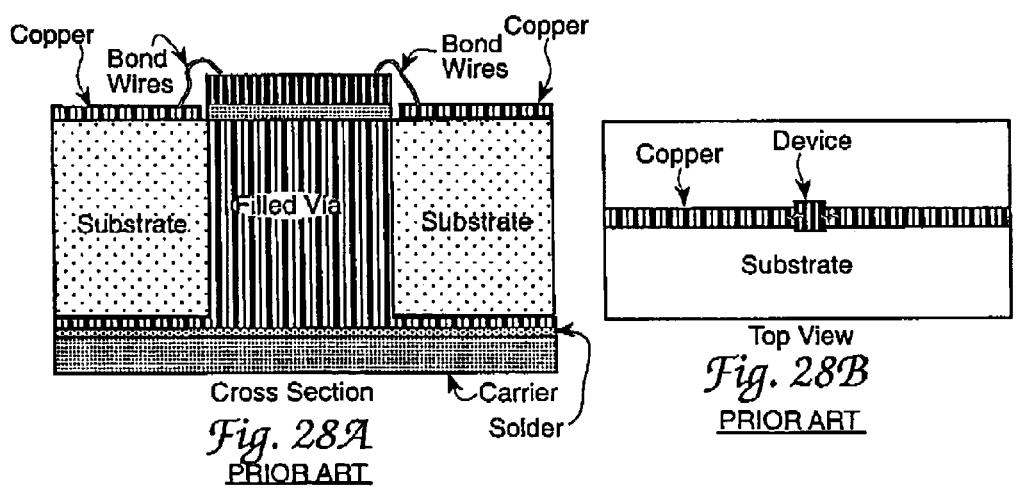
Fig. 28A PRIOR ART
Fig. 28B PRIOR ART

HYBRID ELECTRICAL CIRCUIT METHOD WITH MATED SUBSTRATE CARRIER METHOD

RIGHTS OF THE GOVERNMENT

The invention described herein may be manufactured and used by or for the Government of the United States for all governmental purposes without the payment of any royalty.

BACKGROUND OF THE INVENTION

In the development of radio frequency circuits and especially microwave radio frequency circuits two different approaches to experimental or work in progress circuit implementation are often used. These approaches are the monolithic microwave integrated circuit (MMIC) and the hybrid integrated circuit. The MMIC process consists here of an entire circuit including active and passive elements being fabricated on a part of a wafer of semiconductor material. In the hybrid approach, the active element(s) is/are fabricated on a semiconductor material wafer and the remaining portions of the circuit are fabricated on a dielectric substrate. The individual parts are then assembled on a solid metal carrier that holds the circuit together mechanically. The carrier also provides a common ground plane and acts as a thermal heat sink.

The MMIC has the advantage of being very small, accurate, and repeatable and is indeed the ultimate goal of many circuit development efforts. Some disadvantages of the MMIC technique are however the large investment in time and other resources needed for each new iteration of a design, the imposed small circuit size (which limits the electrical size of the passive elements and types of circuit elements that are realizable), a minimum tuning capability, and a wasting of active semiconductor material to make passive components. The hybrid circuit offers advantages with respect to design flexibility as a result of its larger size, increased range of tuning to meet specifications, and the avoidance of costly device material waste on passive component realization. Hybrid circuits suffer from being considerably larger in physical size, and more importantly have limited accuracy and repeatability characteristics. These inaccuracies stem from an assembly process not having the tight tolerances of semiconductor fabrication technology. Notwithstanding these difficulties however the hybrid integrated circuit remains a necessary part of the development cycle for many circuits and indeed the final configuration of many circuit designs particularly in the radio frequency and microwave integrated circuit arts.

It is perhaps worth mention in this background discussion that a radio frequency signal processing circuit and particularly a transmitter circuit intended for use in the microwave range of radio frequencies is, in one of its most technically challenging portions, (i.e., the signal output stage) a power handling circuit, i.e., a circuit capable of generating a specified number of watts of output signal power from a lesser number of watts of input signal power while functioning at an elevated operating frequency. The need for significant output power levels and the absence of high power handling efficiency in such circuits, especially when some form of linear or "class A" circuit operation rather than the more energy efficient "class C" operation is dictated, results in a need for such circuits to have significant power dissipating capability, dissipation without exceeding the operating temperatures acceptable for semiconductor device operation. This power dissipating need usually precludes the mounting of a radio frequency circuit die directly on a ceramic substrate member in a hybrid integrated circuit arrangement for example and requires that an efficient and direct thermal energy circuit be established between the dissipating semiconductor device and some metallic heat sink such as the substrate carrier of the present invention. It is this needed heat dissipating capability which dictates disposition of the radio frequency circuit die in the present invention within an aperture of the substrate member and into direct metallic connection with a chip carrier recess-received pedestal member. In this disposition of the radio frequency circuit die, bond wires may be used to advantage in making connections between the substrate conductor nodes and the circuit die connection pads.

Considering now a related but somewhat different aspect of a hybrid integrated circuit device, circuit designers typically attempt to minimize the length of the bond wires used within an integrated circuit package to for example connect a circuit die to external package pins. This minimizing limits a frequent source of circuit variability and is usually accomplished through use of one or more of three techniques. A first of these techniques involves use of a very thin dielectric material substrate to fabricate the circuit pattern. A typical active device measures four mils in thickness for example and the dielectric materials typically range from 8 mils to 30 mils in thickness for microwave operation. If the designer uses a thin dielectric material (of say 10 mils thickness), the active device can be mounted on a flat carrier and the bond wires will stretch 6 mils from the top of the active device up to the surface of the dielectric material. This arrangement is shown in FIG. 26A and FIG. 26B of the drawings herein where cross sectional and top views appear. FIG. 26A is enlarged and FIG. 26B is of approximately real device size in these drawings. The layer of for example tin/lead solder used to attach the substrate to the substrate carrier in the FIG. 26A drawing and also in the present invention hybrid devices is identified at 2600 in FIG. 26.

In the FIG. 26A and FIG. 26B drawings the carrier is simple to design and fabricate. However, the thinner dielectric material in the substrate limits the networks a designer can realize on the dielectric material surface. With such thin dielectric material for example the fabrication rules usually impose a fixed minimum line width. Thinner dielectric materials in a substrate require smaller line widths to get the same characteristic impedance as is usually achieved with thicker dielectrics. Thus, a thinner dielectric will not realize the high impedance characteristics of a thicker dielectric material.

Thin substrates have additional drawbacks in a hole milling process. In addition to inherent fragility the milling bit must extend some distance into the dielectric material during a substrate milling operation in order to ensure all the surface metal is removed and obtain a clean cut for via hole or other use. With a thin dielectric material, the amount of removed dielectric material becomes a significant percent of the total thickness and can thereby cause objectionable inaccuracies in the circuit modeling. Modeling assumes a constant substrate thickness however machining removes some substrate and thereby can reduce the modeling accuracy. This effect is minimized when thicker substrates are used.

The second bond wire limiting technique is to build a ridge of metal called a "pedestal" on the carrier. Typically the pedestal is made to place the top surface of the active device at the level of the dielectric material top surface so the bond wire length for the device connection is minimized. The pedestal height may be varied to allow thicker device or substrate materials thus eliminating the drawbacks of thin dielectric materials. This technique is shown in the drawings of FIG. 27A and FIG. 27B where the pedestal resides between two substrate members that are joined by bond wires comprising for example active device connections. This technique however poses severe limitations on a device designer since the FIG. 27A and FIG. 27B configuration has the effect of physically separating circuit blocks in the lateral direction by the presence of an active device. As a result of this separation any feedback arrangement in the circuit will necessarily include a bond wire connection between circuit blocks and this is not desirable from both circuit characteristics tolerance and fabrication cost viewpoints. Having pedestal-separated hybrid device pieces also makes the packaging more difficult and less repeatable. The pedestal disposition arrangement therefore minimizes the length of the bond wires to the active device but can introduce longer bond wires in other locations such as feedback paths. Moreover if the circuit needs a short circuit between a surface conductor and the carrier at any location, a bond wire is still needed and its length is the height of the substrate dielectric material.

The third bond wire limiting technique uses filled via-holes for connecting both active and passive components. Various methods have been reported for the filled via-hole process depending on the substrate being used. If an alumina substrate is used, the filled via-hole process may employ the technique of Bujatti and Sechii as disclosed in U.S. Pat. No. 5,023,994. This technique however requires fabrication temperatures in excess of 250 degree Celsius and is therefore limiting with respect to substrate materials and device materials for examples. The filled via-hole arrangement is shown in FIG. 28A and FIG. 28B of the drawings. Conventional methodologies for both of these types of substrates therefore require added processing steps along with chemical usage to fill the via-holes. These added steps dramatically increase the cost and cycle time to build a hybrid microwave circuit and are therefore believed to be less desirable than the bond wire limiting achieved with the present invention.

To summarize these paragraphs of background it may be appreciated that heretofore there has not been available to the hybrid circuit designer an arrangement in which combined electrical grounding, heat sinking capability and substrate physical support can be made available at randomly selected locations over the extent of the substrate in a hybrid integrated circuit device. The filled via hole process has been considered for this role but has been less than desirable in that it is difficult to fabricate satisfactorily and has other disadvantages. Additionally the etching processes which may be applied to a substrate and its mating carrier do not result in interfitted elements of desirably precise geometry and small tolerance relationships. It has moreover been difficult to provide part-machining capability of both the accuracy and human interface convenience needed for integrated circuit-compatible hybrid circuit fabrications seeking to avoid the filled via hole and the etching accomplished hybrid device fabrication techniques. The present invention is believed to answer these needs.

SUMMARY OF THE INVENTION

The present invention provides a combined hybrid integrated circuit and mating substrate carrier in which desirable low ground plane electrical impedance, favorable structural integrity and effective thermal energy conduction are achieved. The invention is seen as an improvement to the filled via hole technique often used in radio frequency integrated circuit devices.

It is therefore an object of the present invention to provide a hybrid integrated circuit and carrier combination of improved electrical, physical and thermal characteristics.

It is another object of the invention to provide a hybrid electronic circuit and mating substrate carrier combination that is useful for radio frequency, digital, audio and other classes of electronic circuits.

It is another object of the invention to provide a hybrid integrated circuit and carrier combination that is improved in characteristics and manufacturability with respect to the filled via hole hybrid integrated circuit arrangement.

It is another object of the invention to provide a hybrid integrated circuit and carrier combination in which the benefits of a custom fabricated substrate carrier are realized.

It is another object of the invention to provide a hybrid integrated circuit and carrier combination in which the benefits of a machined custom substrate carrier are realized.

It is another object of the invention to provide a hybrid integrated circuit and carrier combination in which the benefits of an automated numerically controlled machined custom substrate carrier are realized.

It is another object of the invention to provide a hybrid integrated circuit and carrier combination in which the benefits of a multiple point electrical, structural and thermal supplementing of a substrate ground plane element by a substrate carrier element are achieved.

It is another object of the invention to provide a hybrid integrated circuit and carrier combination in which need for chemically etched via holes is reduced or avoided.

It is another object of the invention to provide a hybrid integrated circuit and carrier combination in which a substrate electrical ground plane disposed in multiple physical planes can be accommodated by the mating substrate carrier element.

It is another object of the invention to provide a hybrid integrated circuit and carrier combination in which the need for bonding wires is reduced or eliminated.

It is another object of the invention to provide a hybrid integrated circuit and carrier combination in which the benefits of a plurality of metallic mechanical connections between a hybrid integrated circuit substrate and its mated substrate carrier element are achieved.

It is another object of the invention to provide a hybrid integrated circuit and carrier combination capable of providing both the small pillar and the larger pedestal type of grounded element connections with a substrate element and with an integrated circuit element.

It is another object of the invention to combine the capabilities of commercially available precision machining software with the characteristics of custom software to achieve an improved microwave hybrid circuit device while circumventing a number of fabrication limitations.

These and other objects of the invention will become apparent as the description of the representative embodiments proceeds.

These and other objects of the invention are achieved by the low electrical impedance thermally efficient method of mounting a substrate-received hybrid electronic circuit device in a device-supporting metallic carrier member, said method comprising the steps of:

disposing a plurality of thickness-traversing apertures in precisely defined, circuit trace and ground plane conductor-inclusive, lateral locations of said hybrid circuit device substrate;

forming a substrate-receiving recess in said device-supporting metallic carrier member;

said forming step including leaving a plurality of upstanding chip carrier metal-comprised pillar members disposed in selected precise lateral locations across a floor portion of said metallic carrier member substrate-receiving recess;

each said upstanding device carrier metal-comprised pillar member being disposed in a recess location laterally registered with one of said substrate thickness-traversing apertures;

each said upstanding device carrier metal-comprised pillar member including an upstanding portion entering one of said substrate thickness-traversing apertures and extending through said ground plane conductor elements and said substrate circuit trace in an assembled-device condition;

joining each said upstanding device carrier metal-comprised pillar member with surrounding portions of said substrate circuit trace and said ground plane conductor elements using a thermally responsive conductive media.

BRIEF DESCRIPTION OF THE DRAWING

The accompanying drawings incorporated in and forming a part of the specification, illustrate several aspects of the present invention and together with the description serve to explain the principles of the invention. In the drawings:

FIG. 1A represents a top view of a milling machine usable in fabricating a substrate carrier according to the present invention.

FIG. 1B represents a front, motor-up, view of a milling machine usable in fabricating a substrate carrier according to the present invention.

FIG. 1C shows a side, motor-up, view of a milling machine usable in fabricating a substrate carrier according to the present invention.

FIG. 1D shows a side, motor-down, view of a milling machine usable in fabricating a substrate carrier according to the present invention.

FIG. 2A shows a bottom view of a milling machine and depth limiter usable in fabricating a substrate carrier according to the present invention.

FIG. 2B shows a side view of an in-position milling machine and depth limiter usable in fabricating a substrate carrier according to the present invention.

FIG. 3 shows a top view of starting chip carrier stock and a directional convention used in the present document.

FIG. 7 shows a substrate carrier with a first set of boxes defined.

FIG. 8A shows a substrate carrier with a second set of boxes defined.

FIG. 8B shows a substrate carrier with total boxes defined thus far.

FIG. 9A shows a substrate carrier with a third set of boxes defined.

FIG. 9B shows a substrate carrier with horizontal boxes on y edges.

FIG. 24A shows carrier and data structures when stopped at a second pillar stopping edge after the second box has been closed.

FIG. 24B shows a thus-far completed representation of the FIG. 12A through FIG. 24B special spacing situation; six boxes completed and none open.

FIG. 25A shows carrier and data structures stopped at a second pillar stopping edge after the entire edge has been processed.

FIG. 25B shows a thus-far completed representation of the FIG. 12A through FIG. 25B special spacing situation; all boxes are completed.

FIG. 26A shows an enlarged cross sectional view of a prior art thin substrate hybrid device comprised of substrate, carrier, and die.

FIG. 26B shows an approximately real size top view representation of the FIG. 26A hybrid circuit device.

FIG. 27A shows an enlarged cross sectional view of a prior art pedestal-inclusive hybrid device comprised of substrate, carrier, and die.

FIG. 27B shows an approximately real size top view representation of the FIG. 27A hybrid circuit device.

FIG. 28A shows an enlarged cross sectional view of a prior art filled via hybrid device comprised of substrate, carrier, and die.

FIG. 28B shows an approximately real size top view representation of the FIG. 28A hybrid circuit device.

DETAILED DESCRIPTION OF THE INVENTION

Figure 4:
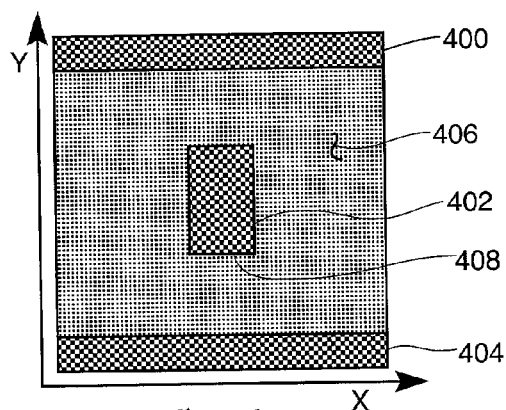
FIG. 4 shows an exemplary substrate carrier with removable and remaining metal areas.

A practicing of the present invention involves fabrication of a substrate member of specific physical dimensions with a precise pattern of apertures or via holes disposed in selected locations across the surface of this substrate and with an additional opening in the substrate for receiving an integrated circuit die, a die which mounts directly on a metallic pedestal of the chip carrier. The invention further involves fabrication of a mating substrate carrier member, from a material such as brass, in which there is disposed a recess or receptacle closely conforming with the substrate overall dimensions and containing an array of upstanding pedestal members and pillars or mesa members. The pedestal members are located in registration with integrated circuit die-receiving apertures located in the substrate and the pillar members are located in registration with the apertures or via holes of the substrate precise pattern.

Fabrication of two mating parts of this nature is believed within the capabilities of a person of ordinary skill in the machining or mechanical apparatus or the etching arts—especially since the relevant technology is mechanical rather than chemical or biological in nature. Applicants nevertheless disclose herein a computer-aided process usable in performing these fabrications with a minimum of human input and supervision and with desirable repeatability and accuracy. This process includes the performance of substrate carrier machining under the control of a suitably programmed personal computer. In the descriptive material following and in the folders of files disclosed on the compact disc appendix of this application there are numerous references to the invention using the expression "UCCAS"; this expression is an abbreviation for the name "Unified Custom Carrier and Substrate", the name used by the inventors and colleagues in their laboratory in referring to the invention.

The Compact Disc appendix included in the U.S. Patent and Trademark Office file of the present patent document is submitted in the form of two identical disc copies each including two file folders. One of these file folders, the folder "uccas_code" is of 99.1 Kilobytes (101,559 bytes) size, contains 42 individual files and is dated Sep. 24, 2001; this file folder discloses software code used in embodiment of the invention. The second of these file folders, the folder "uccas_examples" is of 898 bytes size, contains 3 individual files and is dated Sep. 24, 2001; this file folder discloses sample data usable to verify operation of the invention. The contents of these compact disc file folder materials are hereby incorporated by reference herein.

The uccas_code and uccas_examples folders of the compact disc appendix contain individual files of the following semicolon-separated names:

Folder: uccas_code

CIRCLE.M; draw_box.m; draw_box2.m; draw_box3.m; dtype1.m; dtype2.m; dtype3.m; dtype4.m; dtype5.m; dtype6.m; find_box.m; find_extremes.m; find_xmaxa.m; find_xmaxb.m; find_xmina.m; find_xminb.m; find_ymax.m; find_ymax_range.m; find_ymax_st.m; find_ymin.m; find_ymin_range.m; find_ymin_st.m; get_pillars.m; hole_check.m; insulate.m; insulate_box_polish.m; insulate_box_rough.m; layout.m; layout_serp.m; my_error_uccas.m; parse_gds.m; parse_techfile.m; remove_box.m; sort_check.m; uccas.m; writedxf.m; writegerber.m; write_carrier_files.m; zoom_full_view.m; zoom_start.m; zoom_stop.m; zoom_uccas.m.

Folder: uccas_examples techfile.utf; test1.gds; test2.gds.

The following material explains the operation of the milling machine algorithm by way of focus on the steps used to mill an exemplary substrate carrier.

UCCAS Algorithm

Summary of Algorithm Steps:
1) Read in GDSII file
2) Read in technology file
3) Write DXF files for the top metal layer and circuit boundary layer for the substrate
4) Process GDSII data to get information about the carrier
   a) Physical dimensions of carrier
   b) Location and size of each pillar 5) Draw what carrier will look like
6) Create tool paths to mill the carrier
7) Write Gerber files for the carrier milling, carrier cutting, and the substrate holes For the UCCAS process, step 6 in this sequence is a key to making this entire process operational. The remainder of these steps support step 6. Therefore the following disclosure focuses on a word and picture description of how step 6 functions and the limitations that are circumvented.

Milling Machine Description

A miniature milling machine such as the LPKF Laser and Electronics model 91S/VS machine made in Garbsen Germany and sold by the manufacturer's branch at 2820 SW Bobery Road Wilsonville, Oreg. 97070 or an equivalent machine made by another manufacturer may be used in the following fabrication of parts for the present invention. FIG. 1A through FIG. 1D in the drawings shows a basic top, front, and side representations of the milling machine 101 used. In these drawings the surface the material to be machined appears at 100 and a raised arm 102 is attached to the base of the machine 101 by supports 106 on the side. This arm 102 can move from the left edge of the machine to the right edge. The raised arm 102 supports the motor housing 104. The motor housing 104 can move from the bottom edge of the machine to the top edge as shown in FIG. 1A. The milling bit 108 can be placed at any location over the material to be machined by the combination of the raised arm 102 moving horizontally and the motor housing 104 moving vertically. The motor housing 104 has two settings, up or down. When the motor is up, FIG. 1C, the milling bit 108 can be moved around without the bit touching the material to be machined. When the motor is down, FIG. 1D, the milling bit can be moved around with the bit milling the material.

In the FIG. 1 drawings when the bit 108 is down, a part of the motor housing 104, the depth limiter 200, actually rides along the top surface of the material to be machined, at 200. FIG. 2B shows the configuration. The milling bit 108 attaches to the center of the motor and is surrounded by the depth limiter 200 as shown in FIG. 2A. When the motor housing 104 is down, the depth limiter 200 rides along the surface of the material 202 and the bit is spinning in the center of the depth limiter opening. The depth of the cut is controlled by adjusting the bottom of the bit 108 relative to the bottom of the depth limiter 200.

Set-up Considerations

The milling machine 101 is not specifically made to machine metal. Machining metals with the FIG. 1 apparatus therefore is most successful if the bit is used only to mill and not drill the material to be machined. Milling is a process where the bit moves horizontally and removes material with the side of the bit. Drilling is a process where the bit moves vertically into the material and removes material with the bottom of the bit. Therefore, in the present apparatus the motor head can be lowered in only two different locations on the material to be machined 202. The first location is beside the material 202 such that the bit 108 does not drill but the depth limiter 200 rests on the material 202. This situation is shown in the side view of FIG. 2B. The second location in which the motor head can be lowered is over an area that has already been milled under the bit 108 but not milled under some part of the depth limiter 200. For instance if a cut parallel to the y axis were made on the material to be machined 202 in FIG. 3, the bit could be lowered anywhere directly above that cut and not have the bit drill into the material since the material was already milled by the vertical cut. In order to make present invention substrate carriers, the stock metal must be shaped (sheared or cut) prior to milling. The metal is shaped such that one dimension of the final carrier (typically the width) is finalized from the dimension of the starting material. Therefore, the starting metal is typically a strip of some width and usually about 8 inches long. The width of the strip is chosen to be approximately 0.5 inches wider than the substrate that will fit on the carrier. Several carriers can be machined out of the strip of starting material. FIG. 3 shows a typical starting material blank; FIG. 3 also shows the convention adopted herein for x and y coordinate directions. Individual carriers are segregated from the remaining FIG. 3 material by making a cut along the material in the y direction all the way through the metal.

The second setup consideration is that the depth limiter 200 should always have contact with the un-machined top of the stock metal 202. This is to ensure the same milling depth over the entire region. If a recess region larger than the depth limiter were machined and the depth limiter got into that recess region, the milling depth would change and the depth limiter 200 would not be able to escape from this recess. Therefore, the carrier must be processed in the positive x direction i.e., left to right, as shown in FIG. 3. This insures that the depth limiter 200 always rides on top of the stock material 202.

UCASS Algorithm Step 6

Step 6 in the above summary of the UCASS algorithm represents the heart of the present process. The process of making substrate carriers that match substrates in essence amounts to a question of how to machine the carriers within given constraints. Again, the first constraint is that the motor head must be lowered at a location such that the bit will not drill into the material. The second constraint is that the processing must move from one side of the carrier to the other such that the depth limiter is always resting on un-machined material. The left side of the milling machine bit will always be the areas already milled, and the right side of the bit will be the areas to be milled. A significant goal of the milling machine control program is therefore to specify how the milling bit must move to create the carrier while staying within these constraints.

Figure 5:
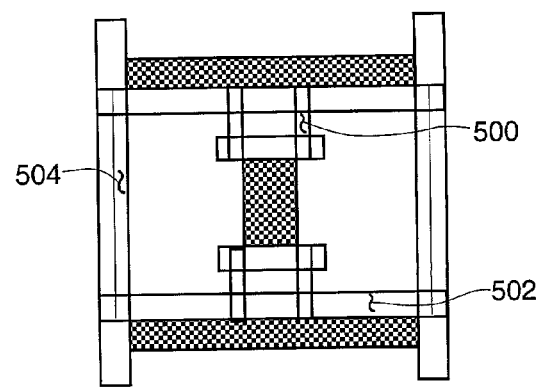
FIG. 5 shows the FIG. 4 exemplary substrate carrier with smaller milling areas defined.

The process of creating the milling machine bit patterns (also called "insulation paths" herein) is accomplished by breaking the substrate carrier work piece into smaller regions called boxes. When all the individual box regions are machined, the carrier is complete with the substrate-mating pillars and pedestals left where they need to be ("pedestals" are herein considered to be larger upstanding non machined areas suitable for integrated circuit die mounting, "pillars" are considered to be smaller upstanding non machined areas suitable for individual substrate via hole mating; pedestals and pillars are therefore somewhat equivalent for present purposes). FIG. 4 in the drawings shows an example of a very simple carrier. The areas 400, 402 and 404 are where the carrier metal will not be machined and the area 406 is where the carrier metal will be machined. In this case, there is only one pillar 408 in the center of the carrier. FIG. 5 shows all the boxes that are defined when working with the FIG. 4 carrier. Milling occurs in the boxes 500, 502, 504 and so on. Although the individual boxes are difficult to see in FIG. 5, the important point is that all of the area to be machined 406 is covered with boxes and the areas 400, 402 and 404 are not. Each box used in FIG. 5 is shown separately and discussed in more detail below herein.

Figure 6A:
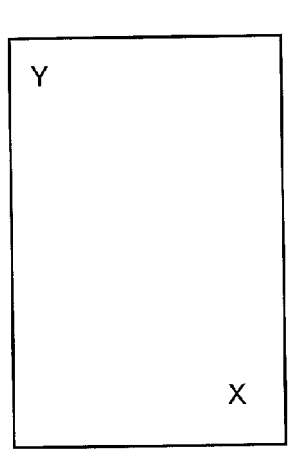
FIG. 6A shows a box used to define insulation paths (i.e., milling machine cutter paths) and path orientation to a substrate carrier.
Figure 6B:
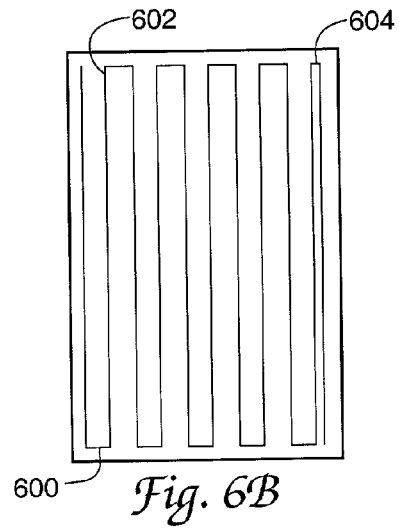
FIG. 6B shows an overall movement path for a milling machine cutter or bit in the box of FIG. 6A.
Figure 6C:
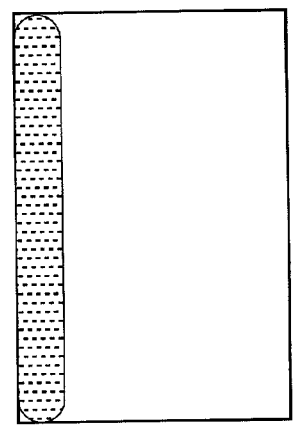
FIG. 6C shows a first movement path for a milling machine cutter or bit and a representative cutter bit width.
Figure 6D:
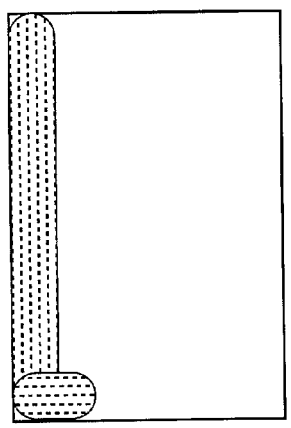
FIG. 6D shows a second movement path for the FIG. 6C milling machine bit.
Figure 6E:
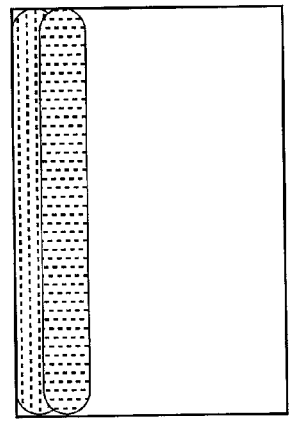
FIG. 6E shows a third movement path for the FIG. 6C milling machine bit.
Figure 6F:
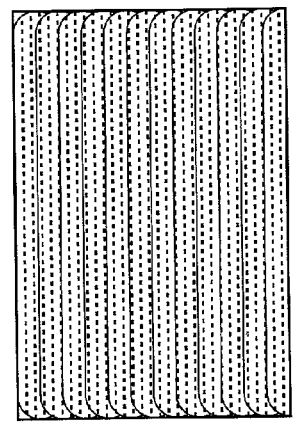
FIG. 6F shows the total milled area once the FIG. 6B milling is completed.
Figure 10A:
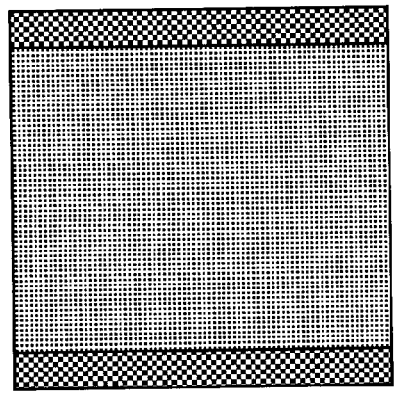
FIG. 10A shows an original substrate carrier having no pillars or pedestals.
Figure 10B:
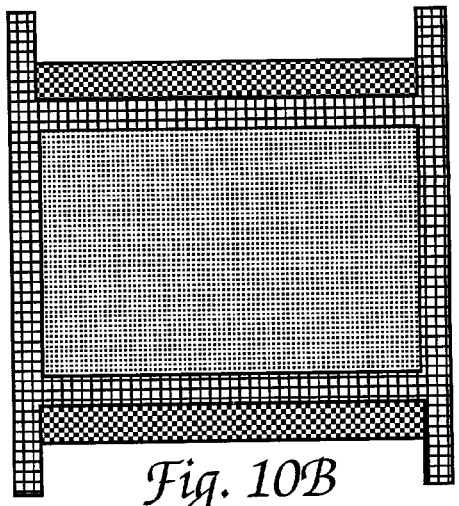
FIG. 10B shows the FIG. 10A carrier with outline boxes defined.
Figure 10C:
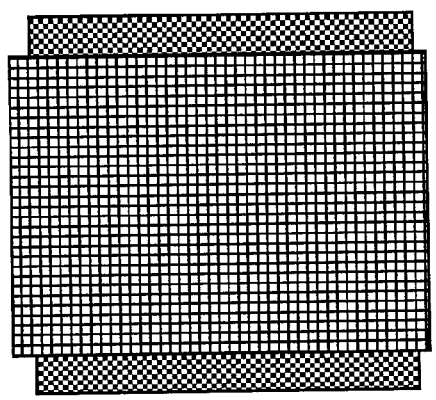
FIG. 10C shows the FIG. 10A carrier with final boxes defined.
Figure 10D:
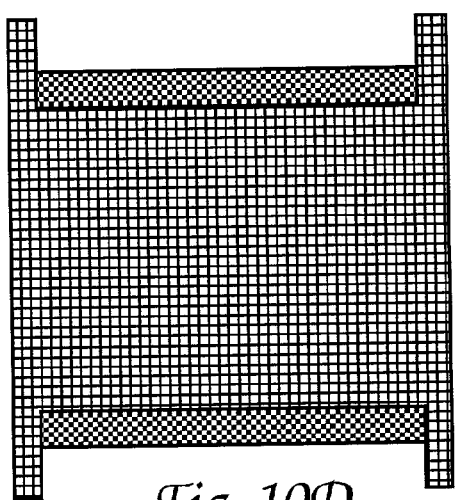
FIG. 10D shows the FIG. 10A carrier with all boxes defined.

Once the FIG. 5 boxes have been defined, the process for making the insulation paths is not difficult. One insulation path is defined as the path the milling bit 108 will take from the time it is lowered to the time it is raised again. Each box receives one insulation path. FIG. 6B in the drawings shows the appearance of insulation paths in a box. The starting point is always the top left of the box. The path then moves to the bottom of the box. The second movement is one-half of the milling bit diameter in the x direction as shown at 600 in FIG. 6B. The third movement is back to the top of the box as shown at 602 in FIG. 6B and so-on. The general pattern is to make one move in the y direction (from one extreme of the box to the other) and then move one half of the milling bit diameter in the positive x direction. This is continued until the move in x would put the edge of the milling bit outside of the box. The last movement in x is adjusted so the edge of the milling bit will be at the edge of the box. This adjustment can be easily seen at 604 in FIG. 6B where the right-most vertical line has a much smaller spacing than the other vertical lines. FIGS. 6C through 6F show the same path as FIG. 6B but now showing the width of the milling bit. The only exception to this milling bit progression occurs if a horizontal cut is needed. These cuts will only be allowed to be one bit width and are used only in limited situations. In the horizontal cut case the insulation path starts at the left edge and goes to the right edge. It is notable that the horizontal movement each time is one-half of the milling bit diameter; this degree of overlap is however a matter of user election. This means that each new vertical cut will only remove one half of the width of the milling tool. This arrangement reduces the load on the milling machine motor and helps preserve milling bit lifetime.

Since creation of the insulation paths within a box is therefore somewhat standardized, the more complex part of the present process lies in defining the boxes that break up the carrier area. The different boxes described below will be shown in the order created in the program and not in the order that their corresponding insulation paths are to be machined. In fact once all the insulation paths are created, they are sorted in the x direction. This sorting procedure causes the milling to start at the left edge of the carrier and move to the right edge. More importantly, this sorting enforces the second constraint that the depth limiter always rests on un-machined metal.

The first set of FIG. 4 and FIG. 5-*defined* boxes that are created are shown in FIG. 7. The areas 700 and 702 in FIG. 7 are the boxes. These boxes define the horizontal edges of the carrier. When the carrier is cut out, the cut will go through this box. The first box at 700 is made to be longer than the width of the carrier. This way the milling bit is lowered such that it does not touch the material being cut but the depth limiter does. This box 700 goes the entire width of the carrier. These first boxes are critical to adhering to the constraint of not using the milling bit to drill. The left box at 700 defines the initial cut into the carrier. Following the FIG. 7 cuts the milling bit can be set down over the initial cut at 700 without the bit drilling into the material.

The second set of FIG. 4 and FIG. 5-*defined* boxes that are created are shown in FIG. 8A. The FIG. 8 drawings in fact show the new boxes created in FIG. 8A and all of the thus-far created boxes in FIG. 8B. This showing will be the standard from this point forward in this discussion. The FIG. 8A new boxes 800 and 802 define the upper most and lower most areas to be milled. As a result of the above-described milling path sorting and the milling path sorting in the x direction, the first area to be milled is the left most box in FIG. 7. The next two boxes to be milled are the new boxes shown in FIG. 8A. When these areas are milled, the bit will not drill into the substrate carrier material being milled because the motor head comes down directly over a box that was defined in the first set of boxes. By milling the carrier from left to right, the depth limiter will always rest on un-machined metal, thus ensuring the proper milling depth. Thus far, the boundaries of the carrier have been milled out. Note that the necessity of the cut along the upper and lower edge of the carrier force a design rule of no pillars being allowed within one tool diameter of the y boundaries of the carrier.

The third set of boxes that are created are shown in FIG. 9A. Each pillar receives horizontal cuts as the cuts 900 and 902 along the top and the bottom of each pillar. These cuts are made so that the edges of each pillar are clean and are needed to keep the bit from drilling. The boxes that will be created over and under the pillar in later steps will be aligned with the edge of the pillar. If these horizontal boxes were not cut first, the milling bit would have to drill into metal when milling above or below the pillar. All of the boxes milled thus-far are shown in the FIG. 9B drawing. (FIG. 9B shows the order of box definition not the order of machining as is explained above—therefore the cut 902 for example does not imply the use of drilling.)

For all carriers, the first three sets of boxes are easily defined and are used to outline the carrier and any pillars as has been shown in the FIG. 5 through FIG. 9 process steps. These initial boxes are called outline boxes. The only exception is if there are no pillars. In this case, the first two sets of boxes are defined and then one final box is defined that covers the remainder of the carrier metal. FIG. 10 shows this case. This carrier is the same as the one shown in the previous examples but the center pillar is removed. FIG. 10 shows outline boxes, final box and all boxes in the views of FIG. 10A, FIG. 10B, FIG. 10C and FIG. 10D.

Once the outline boxes have been defined, a next set of boxes is created to remove the remainder of the carrier metal to form the desired recess and leave the pedestal/pillar areas standing in the recess. This arrangement is satisfactory so long as the standing areas are square and they are separated in the x or y direction by at least one milling tool diameter. The general algorithm functions by starting from the left edge of the carrier and moving right. The program manages two data structures as it moves in the x direction. The first is a list of all the completed boxes and the second is a list of all the processing boxes. A processing box means that some of the values for the box have been entered but not all of them. A processing box is moved to the completed box data structure once all the values have been determined. The values for the box are the minimum and maximum x and y locations (values stored as xmin, ymin, xmax, and ymax). As the program moves across the carrier the two data structures are processed at each edge of each pillar. If the edge of the pillar is a starting edge (left edge of the pillar), then one box is moved from the processing boxes to the completed boxes and two new entries are made into the processing boxes structure. If the edge of the pillar is an ending edge (right edge of the pillar), then two boxes are moved from the processing boxes to the completed boxes and one new entry is made into the processing boxes structure. There are some special cases to consider but these are discussed later. To demonstrate how this processing functions, the process will be demonstrated on the carrier shown in the previous examples. For each step, the entries for both data structures are listed. The drawings used have a diagram of all the completed boxes to that point and a diagram of only the new completed boxes. New processing boxes can not be drawn since all their information is not known. The outline boxes are already stored in the completed box data structure. Those entries are ignored during this explanation in the interest of simplicity.

Figure 11:
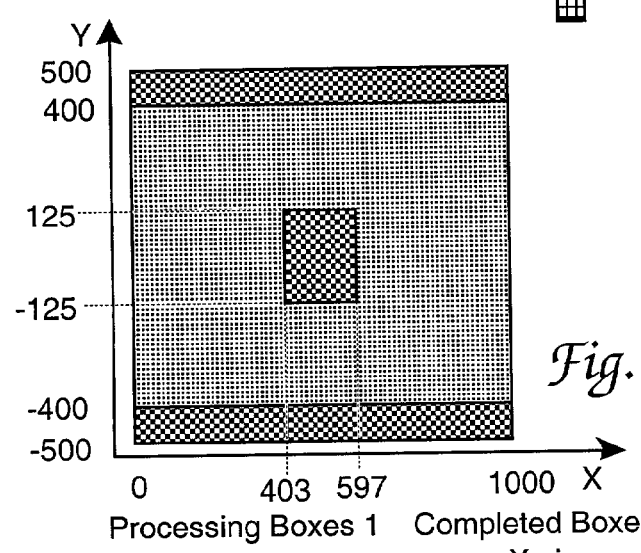
FIG. 11 shows carrier boxes and data structures at a sweep beginning along with important feature locations.

FIG. 11 in the drawings shows the starting point of the sweep in the x direction i.e., the x=0 point along the x axis. Initial boxes as shown in FIG. 5 through FIG. 9 are however not shown in FIG. 1 in the interest of simplicity. The number of completed boxes are the same in FIG. 11 as those in FIG. 8. FIG. 11 shows the initial entries into the data structures with dimensions being in mills or thousandths of an inch. FIG. 11 also shows the locations of important features in the carrier. The xmin, ymin and ymax values of the initial processing box are set by the boundary of the carrier. The xmax value will be set later. The original carrier had a minumum y of −400 and a maximum y of 400. All the data stored in the boxes data structures are at the location of the center of the milling machine bit. This makes the processing of insulation paths easier. The milling bit for this example is a 79 mil diameter end mill. This explains why ymax is 360.5 and ymin is −360.5. These values are adjusted by the radius (39.5) of the milling bit. For the remainder of this example, radius is always 39.5 with all values being expressed in mils or thousandths of an inch.

When the program comes to a pillar feature (either a start or a stop edge), it has to do some processing at this x location. The processing depends on the type of pillar location and whether the feature was a start or stop edge on the pillar. In every case, the first pillar feature is a start edge. In order to close a box (move from processing boxes to completed boxes), the program needs information to find the correct box in the processing box structure. The program searches for features above and below the pillar having the current edge the program is processing. The value that it finds above is called ymaxs (maximum y for searching) and the value that it finds below is called ymins (minimum y for searching). The proper box to close is identified when ymaxs is equal to the ymax of the box and ymins is equal to the ymin of the box. This example is a very simple case where there is only one box being processed however the described process is needed for more complicated carriers where there may many entries in the processing box data structure. To find the ymaxs value the program looks for any pillars above the current x location i.e., pillars above the pillar that spans the current edge being processed. There are three possible cases. The first is if there are no pillars above the current pillar's starting edge. The ymaxs value in this case is set to the maximum y value of the carrier. The second case is if there is one pillar above the current pillar's starting edge. The ymaxs value in this case is set to the minimum y of the pillar that is above the current pillar. The third case is if there are multiple pillars above the current pillar's starting edge. The ymaxs value in this case is the minimum y value of the pillar that is closest to the current pillar. To find the ymins value, the program does the same as for the ymaxs value but it now searches below the current pillar. Once the ymaxs and ymins values are found, they are used to search the processing box data structure. Ymaxs and ymins are shifted by the radius of the milling tool since this is how the values are stored in the processing box data structure. When the proper entry in the processing box is found, the xmax of that box is set to the x location of the pillar edge being processed minus the radius. The box is then removed from the processing box data structure and added to the completed box data structure. Now one box is closed. Two new boxes must now be opened.

For a start edge of a pillar, the program also opens two new entries into the processing box structure. The xmin, ymax, and ymin for both boxes are already known. The xmin is the current location of the starting edge of the pillar. For the box above the pillar, the ymin of the box is set to the maximum y value of the pillar and the ymax value of the box is set to ymaxs, which was found in the searching done for closing out a box. For the box below the pillar, the ymax of the box is set to the minmum y value of the pillar and the ymin value of the box is set to ymins, which was found in the searching done for closing out a box.

Figure 12A:
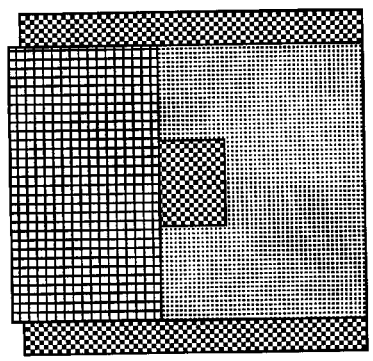
FIG. 12A shows carrier and data structures at a first stop along a carrier sweep.
Figure 12B:
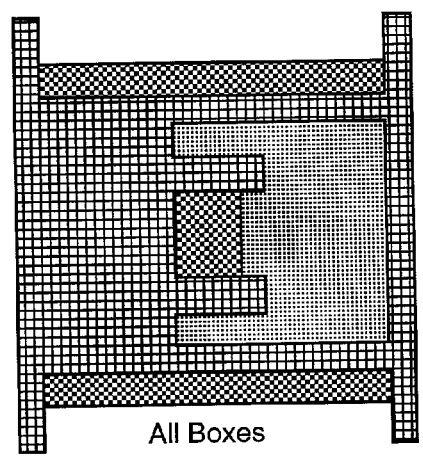
FIG. 12B shows the completed one box and two in progress at this point in the processing.
Figure 13A:
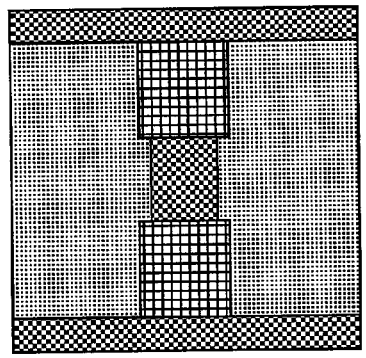
FIG. 13A shows carrier and data structures at a second stop of the FIG. 12A structure.
Figure 13B:
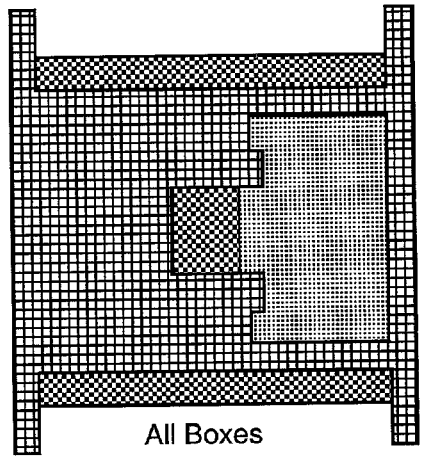
FIG. 13B shows the three boxes completed and one in process at this point in the FIG. 12A processing.
Figure 14A:
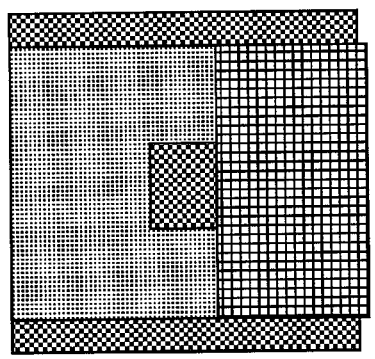
FIG. 14A shows carrier and data structures at the end of carrier sweep of the FIG. 12A structure.

Generally FIG. 12 through FIG. 14 in the drawings show in detail the steps used to create the structure in FIG. 11. FIG. 12A shows the entries into the data structures and a drawing of the new completed box once the program completes processing this pillar x location. FIG. 12 thus shows carrier and data structures at a first stop along the carrier sweep. There is one box completed and two boxes are in process in FIG. 12. To summarize, the program came to the first pillar edge. The first pillar was a starting pillar and so a search at the current x location (403) is needed. A look for pillars above and below the current pillar at the x location finds none. Therefore the ymaxs and ymins were set to 400 and −400 respectfully. These values are scaled by the radius (39.5) and become 360.5 and −360.5. The program then searches the processing boxes to find an entry that has ymax equal to 360.5 and ymin equal to −360.5. The first entry in this structure had these y values and so the xmax entry was set to the x location of the pillar minus the radius (363.5). This box was then put in the completed box data structure. This box is the new box drawn on the carrier diagram in FIG. 12A. Two new entries were made into the processing box data structure. The first was for above the current pillar. Xmin is set to the current x location (403), ymax is set to ymaxs (360.5), and ymin is the maximum y value of the current pillar plus the radius (164.5). The second entry is for below the current pillar. Xmin is set to the current x location (403), ymax is the minumum y value of the current pillar minus the radius (−164.5) and ymin is set to ymins (−360.5). The program has now completed processing at this pillar edge location.

Now the program steps to the next pillar edge location. In this example this is the stopping edge of the pillar. In order to close out two boxes and start a new one, ymaxs and ymins must be determined for this x location. The searching is done in the exact same way as it was done for the starting edge of the pillar. Two boxes must be closed for a stopping pillar edge. The first is above the current pillar. For searching the processing box structure, the program is looking for a ymax equal to ymaxs minus the radius, and ymin equal to the maximum y value of the pillar plus the radius. When the values match, the xmax value is set to the stopping edge x location of the pillar and the box is moved to the completed box data structure. The second box to be removed is below the current pillar. For searching the processing box structure, the program is looking for a ymax equal to the minimum y value of the pillar minus the radius, and ymin equal to ymins plus the radius. When the values match, the xmax value of that box is set to the stopping edge x location of the pillar and the box is moved to the completed box data structure. The program also opens a new box to be processed. The xmin value is the stopping edge x location of the current pillar plus the radius. Ymax is set to ymaxs minus the radius and ymin is set to ymins plus the radius.

FIG. 13 shows the entries into the data structures and a drawing of the newly completed boxes once the program has processed this pillar x location. The program finds the stopping edge of the pillar in the layout. It looked for pillars above and below the current pillar x location (597) and found none. Therefore the ymaxs and ymins were set to 400 and −400 respectfully. These values are scaled by the radius and become 360.5 and −360.5. For the box below the pillar, the program searches for ymax equal to ymaxs (360.5) and ymin equal to the maximum y value of the pillar plus the radius (164.5). These y values are found, xmax is set to 597, and the box moved to the completed box data structure. For the box below the pillar, the program searches for ymax equal to the minimum y value of the pillar minus the radius (−164.5) and ymin equal to ymins (−360.5). These y values are found, xmax set to 597 and the box moved to the completed box data structure. Then a new box is started in the processing box data structure. Xmin set to the current x location (597), ymax set to ymaxs (360.5) and ymin set to ymins (−360.5). FIG. 13B shows the boxes completed through FIG. 13A.

Figure 14B:
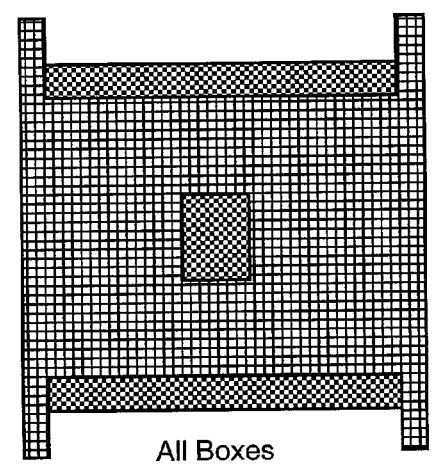
FIG. 14B shows four boxes completed and none in process at the end of the FIG. 12A processing.

This process of stopping on each pillar edge continues until there are no more pillars. When this occurs, the last entry into the processing box data structure is closed out. The xmax value is set to the maximum x of the carrier and the box is moved to the completed box data structure. FIG. 14 shows the entries into the data structures and a drawing of the newly completed box once the program has gone to the right edge of the carrier. Xmax of the last box in the processing box structure is set to 1000. This box is then switched to the completed box data structure. Four boxes are completed in FIG. 14B and none are in progress.

Now that all the boxes have been defined, the remainder of the program is simple. Each box gets an insulation path in the manner described earlier and shown in FIG. 6. These paths are sorted in the x direction and the data is written to a text file.

Special Cases

Figure 15:
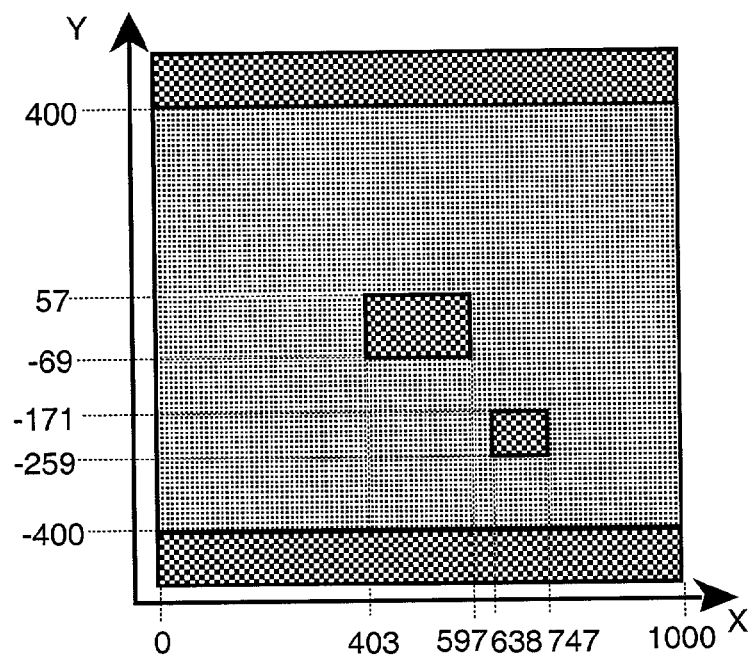
FIG. 15 shows a special spacing case when creating boxes.
Figure 16A:
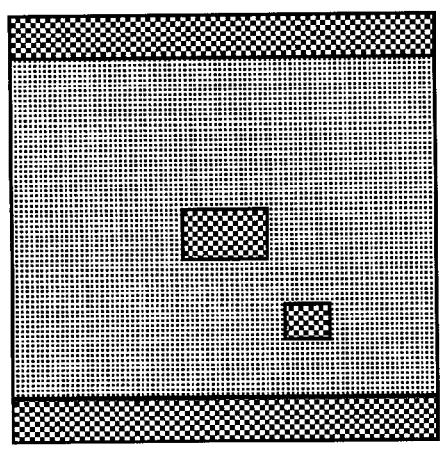
FIG. 16A shows a special spacing situation original layout.
Figure 16B:
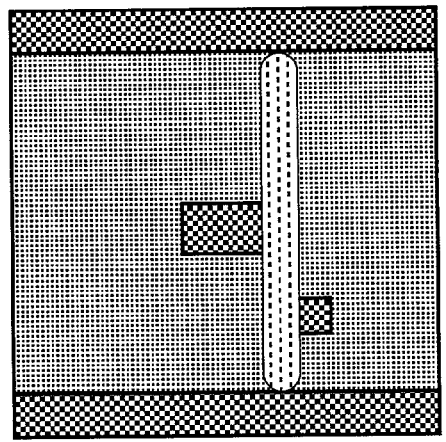
FIG. 16B shows a special spacing situation error situation.

There is a special case that is not handled with the basic algorithm specified above. This is the case when two pillars are spaced by at least one tool diameter in the y direction but less than one tool diameter in the x direction. FIG. 15 shows such a situation. In FIG. 15 the pillars are spaced in y by 102 mills but only 41 mills in x. The problem with this situation is that the tool used to process the carrier has a finite physical dimension, a dimension greater than 41 mills. Generally this situation is handled (as described in detail below) by extending the dimensions of the boxes involved to align with the conflicting pillar edge. From the standard algorithm, when the program comes to the stopping edge of the left pillar (at the 597 location on the x axis) it processes this pillar edge as described above. Two boxes would be completed and one new one would be opened for processing. The new box to be processed would have ymin=−360.5, ymax=360.5, and xmin=636.5. Again xmin gets the x location of the pillar plus the radius of the tool. The tool in this example has a diameter of 79 mils. As the program steps to the next pillar edge which is the starting edge of the right pillar, it first closes out one box. It would search in the y direction and then match those values in the processing box data structure. It would find the box opened previously by the stopping edge of the left pillar. It would then assign the xmax value to be 598.5. Again, xmax gets the x location of the pillar minus the radius of the tool. The problem here is that the xmax value is smaller than the xmin value. There are other cases when this happens but they are not a problem. If the program finds such a case it sets the xmax and xmin values to be the same. A box with the xmax and xmin values equal relates to an insulation path from ymax to ymin along that x value. If this process was allowed to happen for this box, xmnax would be set to be equal to xmin or xmax=636.5. If this insulation path is created it will be 79 mils wide and centered at 636.5. The right edge of this insulation path will be at 676 (center plus radius) which would cut off 38 mills of the right pillar. FIG. 16B shows what would happen with the standard algorithm. The standard algorithm thus breaks down for this FIG. 15 and FIG. 16A case.

There is a simple solution to the FIG. 15 problem of pillar spacing in the x direction of less than one tool diameter. The first part of this solution is for the computer program to recognize that this situation exists. This situation is identified in the searching for the ymax and ymin values at this x location. When searching above the x location of the current pillar, the basic algorithm looks for pillars only at the current x location. Another search is done that is done over a range of the current x location plus or minus one tool diameter. If it is a stopping edge, the range is the x location plus the tool diameter. If it is a starting edge, the range is the x location minus the tool diameter. Now two different searches are done. If the two search values are not the same, then this special case has been identified. So four search values will be set, ymaxs, ymax_range, ymins, and ymin_range. If ymaxs does not equal ymax_range, then the special situation is present above the current pillar. If ymins does not equal ymin_range, then the special situation is present below the current pillar. It is possible to have the special situation above and below the current pillar.

Once the special case situation is identified, the procedure for opening and closing boxes is changed. The situation will be first recognized at a stopping edge pillar. Normally at this edge, two boxes will be closed with the xmax of the boxes to be closed set to the x location of the pillar edge. Two boxes are yet closed now. If the special case does not exist above or below the current pillar, then those boxes are closed as normal. If the special case is found, the xmax value for the box to be closed on that side of the pillar is set to the xmin of the close pillar minus the tool radius. Setting the box xmax to this value will have the insulation path go immediately to the edge of the close pillar.

If the special case is found on either side of the stopping edge pillar, then a new box is not opened as it normally would. One new box is created for each instance of the special case. If the special case occurs both above and below the current pillar, then two new boxes are created. The new box created now is only the width of one tool. This box's x values are set to the average x value of the current pillars edge x location and the close pillars xmin value. If the close pillar is above the current pillar, the ymin value is set to the ymax of the current pillar plus the tool radius. The ymax value is set to the ymin of the close pillar minus the tool radius. If the close pillar is below the current pillar, the ymin value is set to the ymax of the close pillar minus the tool radius. The ymax value is set to the ymin value of the current pillar minus the tool radius. These new cuts are necessary to remove any metal left between the close pillars.

The second part of this special case is when the program gets to the starting edge of the pillar that is close to another pillar in the x direction. This other pillar will be the stopping edge pillar that was described first above. The situation will be identified when the ymaxs and ymax_range values are not equal or the ymins and ymin_range values are not equal. The range searched now is from the current x location to the current x location minus the tool diameter. No new boxes are closed out if the special case is found on either side of the current pillar. Two new boxes are created, one above the pillar and one below the pillar. For the new box above the current pillar, if it is not a special case, then the box is opened as normal. If it is a special case side, the ymin and ymax values of the box are set in the same manner as before. Now the xmin value of the box is set to the xmax value of the close pillar plus the radius of the milling tool. This ensures that the milling bit will cut right on the edge of the close pillar. The same thing happens for the new box below the current pillar. If it is not a special case, the normal procedure occurs. If is a special case, the xmin value of the box is set to the xmax value of close pillar plus the radius of the milling tool. This entire special procedure will be shown with an example.

To demonstrate this special case, the boxes and data structures for the carrier shown in FIG. 15 will be shown. Again, the initial three sets of boxes created will not be shown in the interest of simplicity. The initial layout is shown again in FIG. 17 with the initial entries into the processing and completed box data structures. Note that the two pillars are spaced only by 41 mils along the x axis. The tool diameter in this example is 79 mils, so this is a special situation. The processing box gets the standard entries, which are the same as the first example shown in this document.

Figure 18A:
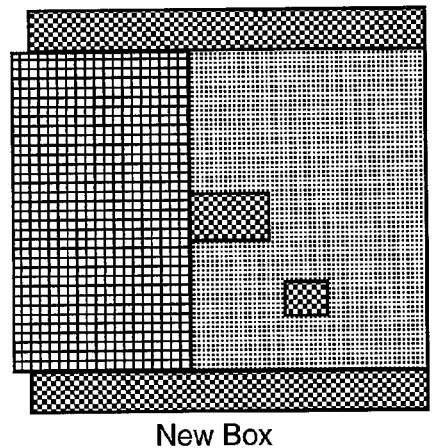
FIG. 18A shows new box carrier and data structures stopped at a first pillar starting edge in a special situation case.
Figure 18B:
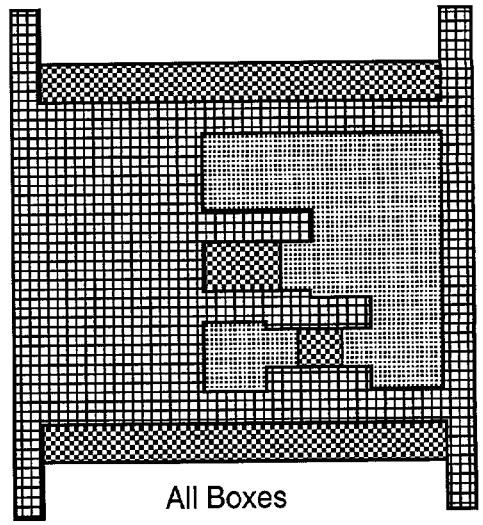
FIG. 18B shows all completed box structures in the FIG. 18A case.

The first milling machine movement is to the starting edge of the left pillar. Since there are no stopping edges prior to this edge, there is no special case involved. One box is closed and moved to the closed box data structure. Two new boxes are opened and put in the processing box data structure. This step is identical to single pillar example earlier in the document. The boxes data structures and drawing of the completed boxes are shown in FIGS. 18A and 18B.

Figure 19A:
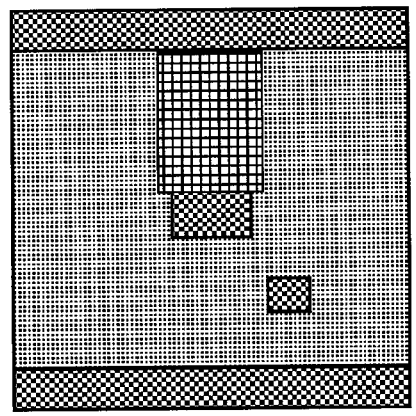
FIG. 19A shows carrier and data structures stopped at a first pillar stopping edge after closure of a box above the pillar.
Figure 19B:
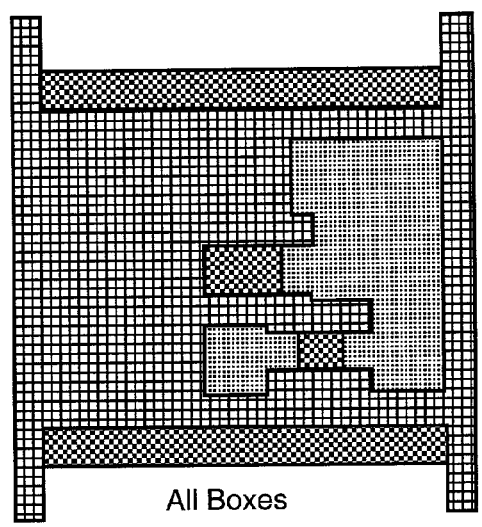
FIG. 19B shows a thus-far completed representation of the FIG. 12A through FIG. 19B special spacing situation.

The second milling machine movement is to the stopping edge of the left pillar. The first step is to close out one box above the pillar. The program searches above the pillar in y at the x location (597) and finds 400 since no pillars are above it. It then searches from the x location (597) to the x location plus the tool diameter (676) and again finds 400 since no pillars are in this range. Therefore the special case is not there and the box is closed out as it normally would be. The status of the boxes data structures after the top box has been closed is shown in FIG. 19A. FIG. 19B shows the status with two boxes completed and one open for processing.

Figure 17:
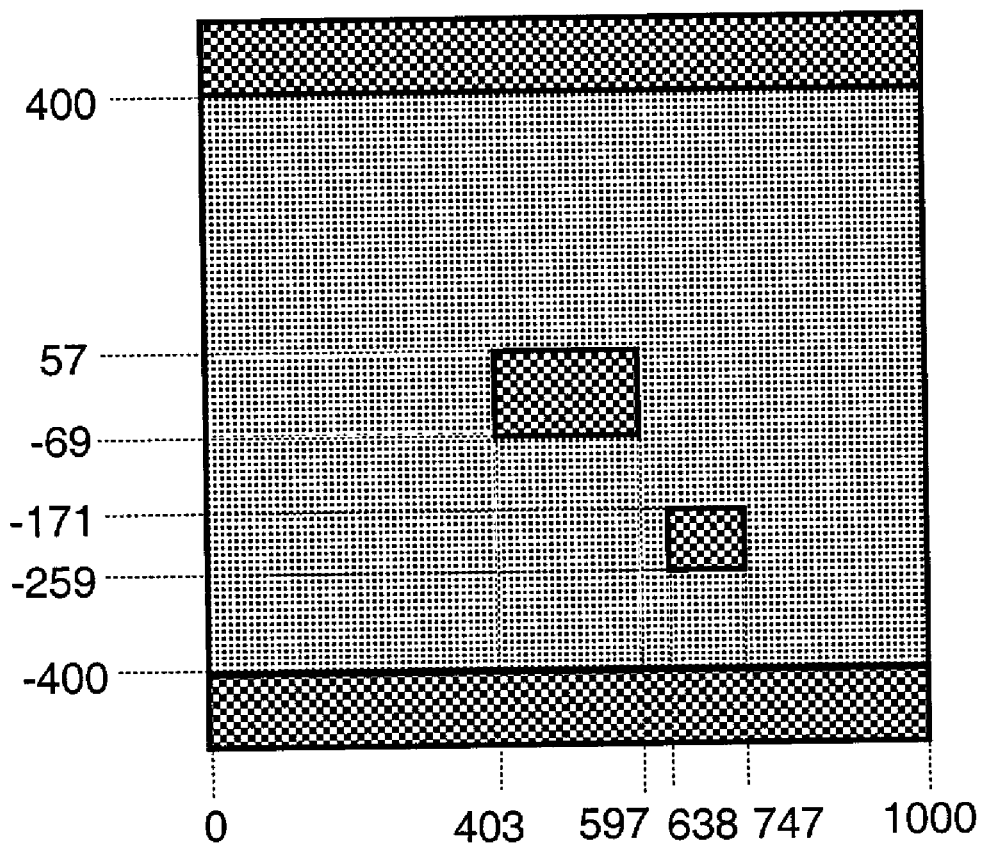
FIG. 17 shows a sweep beginning for a special spacing case.
Figure 20A:
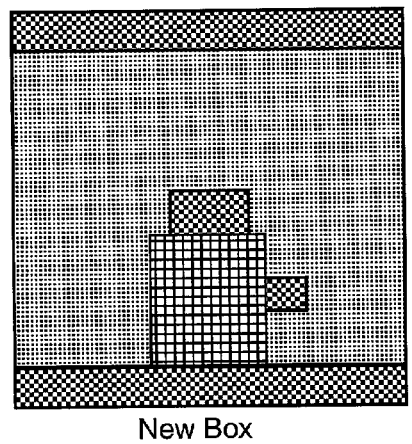
FIG. 20A shows carrier and data structures stopped at a first pillar stopping edge after closure of a box below the pillar.
Figure 20B:
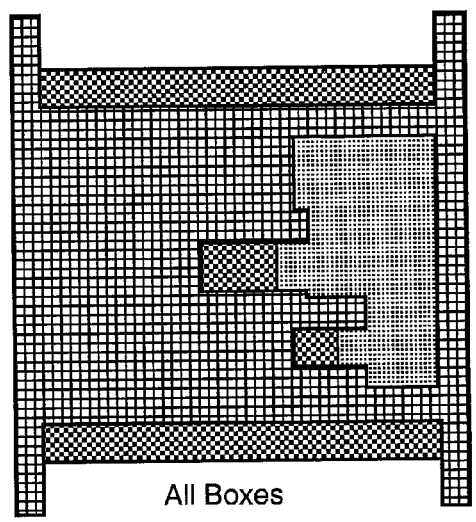
FIG. 20B shows a thus-far completed representation of the FIG. 12A through FIG. 20B special spacing situation.

The second step in the FIG. 15, FIG. 17 special case is to close out another box, which is below the pillar. The program searches below the pillar in the y direction at the x location (597) and finds −400 since no pillars are directly below the pillar edge. It then searches from the x location (597) to the x location plus the tool diameter (676) and finds a value of −171 since there is a pillar in this range. Since these two values are not the same, the special case is identified. The program uses the first ymin value found from searching (−400) and the ymin of the pillar (−69) as the ymax value. These are both scaled by the tool radius and become −360.5 and −108.5 respectfully. The processing box is searched for these values. When it is found, xmax is set to the x location of the close pillar (638) minus the tool radius and becomes 598.5 and is put in the closed box data structure. The boxes, data structures and drawing of the completed boxes are shown in FIG. 20.

Figure 21A:
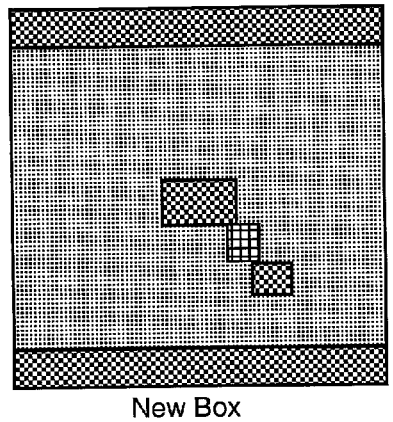
FIG. 21A shows carrier and data structures stopped at a first pillar stopping edge after this edge has been fully processed.
Figure 21B:
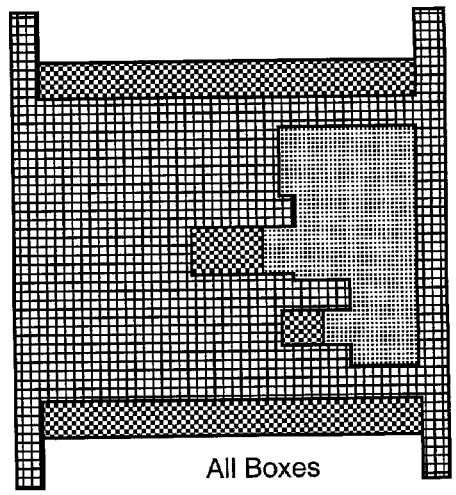
FIG. 21B shows a thus-far completed representation of the FIG. 12A through FIG. 21B special spacing situation; four boxes completed and none open.

The third step at this pillar edge is to open any boxes needed. Since there was a special case at this pillar edge, no standard new box is opened. There was only one special case so one new box is placed directly into the completed box data structure since all the information about it is known. The xmax and xmin values are set to the average of the current pillar x location (597) and the close pillar starting edge x location (638), which is 620.5. Since the close pillar is below the current pillar, the ymax of the new box is set to the current pillar minimum y value minus the tool radius, or −108.5. The ymin of the new box is set to the close pillar maximum y value plus the tool radius, or −131.5. The boxes data structures and drawing of the completed boxes are shown in FIG. 21A and FIG. 21B respectively.

The program now moves on to the next pillar edge which is the starting edge of the right pillar. The first step is to close out one box. The program searches above the pillar in y at the x location (638) and finds 400 since no pillars are directly above the pillar at this location. The program then searches from the x location (638) to the x location minus the tool diameter (559) and finds a value of −69. The program then searches below the pillar in y direction in the same way as above. Since there are no pillars below the current pillar, both searches return a value of −400. Since both y search values are not the same, there is a special case found. No boxes are closed out in this situation.

Figure 22A:
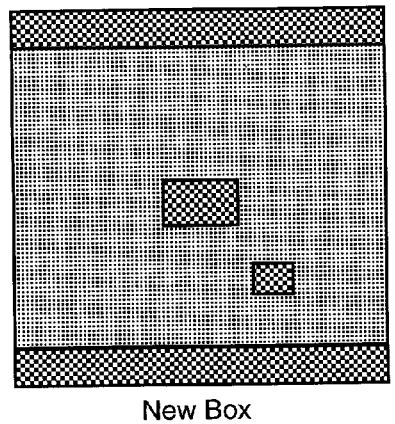
FIG. 22A shows carrier and data structures stopped at a second pillar starting edge after this edge has been fully processed.
Figure 22B:
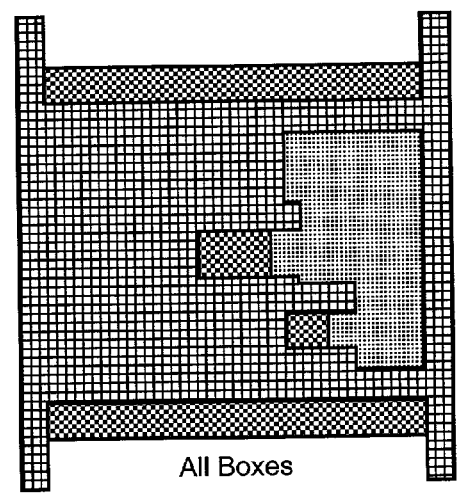
FIG. 22B shows a thus-far completed representation of the FIG. 12A through FIG. 22B special spacing situation; four boxes completed and two open.

Two new boxes will be opened when the special case is found. The program first works on the box above the pillar. Since the y search values are not the same above the pillar, the box that is created is processed differently. The xmin value of the new box in the processing box data structure is set to the x value of the close pillar (597) plus the tool radius (39.5) to become 636.5). Ymax is set to the value of the y value search directly above the current edge x location minus the tool radius (360.5). Ymin is set to the ymax value of the current pillar plus the tool radius (−131.5). The program then works to close the box below the pillar. Since there is no close pillar below the current pillar, this box is processed in the normal way. Xmin is set to the x location of the pillar edge (638). Ymax is set to the minimum y value of the current pillar minus the tool radius (−298.5). Ymin is set to the y value found in searching plus the tool radius (−360.5). FIG. 22A and FIG. 22B shows the boxes data structures and drawing of the completed boxes respectively. No new boxes were completed so there are no new boxes.

Figure 23A:
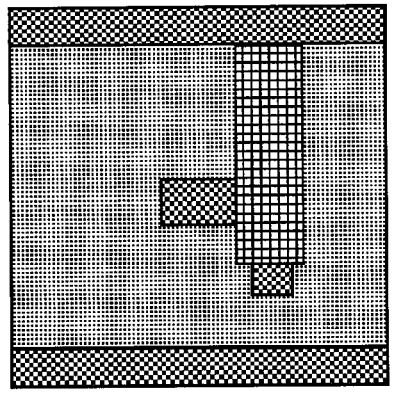
FIG. 23A shows carrier and data structures when stopped at a second pillar stopping edge after one box has been closed.
Figure 23B:
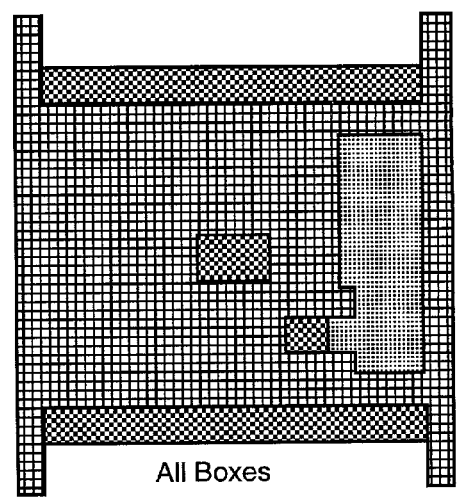
FIG. 23B shows a thus-far completed representation of the FIG. 12A through FIG. 23B special spacing situation; five boxes completed and one open.

The program now moves on to the last pillar edge. Since this is the last edge, no special cases have to be considered. Two boxes are closed and the final box is put into the completed box data structure. First, the box above the pillar is closed. Ymax for searching the processing box is the carrier boundary minus the tool radius (360.5). Ymin for searching the processing box is the pillar maximum y value plus the tool radius (−131.5). These entries are found in the processing box data structure, xmax is set to the x location of the stopping edge (747), and the box is moved to the completed box data structure. FIG. 23A and FIG. 23B respectively show the boxes, data structures and drawing of the completed boxes when this box is closed.

Next, the box below the pillar is closed. Ymax for searching the processing box is the pillar minimum y value minus the tool radius (−298.5). Ymin for searching the processing box is the carrier boundary plus the tool radius (−360.5). These entries are found in the process box data structure, xmax is set to the x location of the stopping edge (747), and the box is moved to the completed box data structure. FIG. 24A and FIG. 24B respectively show the boxes, data structures and drawing of the completed boxes when this box is closed.

The final step for this pillar edge is to create the final box to create the carrier. This box is simple since it is the last one.

No searching is done since all the values are known. Xmin of the box is set to the current pillar x location plus the tool radius (786.5). Xmax is set the maximum x location of the carrier (1000). Ymax is set to the maximum y of the carrier minus the tool radius (360.5) and ymin is set to the minimum y of the carrier plus the tool radius (−360.5). FIG. 25A and FIG. 25B show the boxes data structures and drawing of the completed boxes when the last box is completed.

In addition to the above-recited flowing text description of the computer program disclosed in the main program listing of the appended compact disc applicants also provide the following listing of UCCAS program function calls with narrative explanation. In the following listing applicants are aware that the word "pedestal" is frequently represented with the spelling of "pedastle". Other variations of this spelling may also appear in the following part and in other parts of this document. Corrective changes to these spellings would however render the following function calls and explanatory comments inconsistent with computer code listings included on the compact disc appendix of the present document and are therefore avoided except in instances of plain text narration.

UCCAS Program Function Calls uceas(filename,techfile) (71 lines)
This is the main program. The user can enter just the file name if desired. The techfile is a file specific to this program and has descriptions of process parameters. If no technology file is specified the program looks for a specific name in the current directory. If no file is found, assumed values are used. The filename must be a GDSII layout file without hierarchy.
  [data,errorflag,unit]=parse_gds(filename); (287 lines)
    Data is the structure holding all layout information. Errorflag becomes a 1 if there is an error. Unit variable specifies measurement in microns or mills. Filename is the name of the GDSII file to extract data from.
    Reads in the GDSII data from the filename. The GDSII file is a binary file that must be processed. Each entry in the GDSII file is a number from 0 to 255. This is a decimal representation of one byte (eight 1s or 0s) of binary data. GDSII data is allowed to have 7 data types.
    Data type 0: no data present
    Data type 1: Bit Array
    Data type 2: two-byte signed integer
    Data type 3: four-byte signed integer
    Data type 4: four-byte real
    Data type 5: eight-byte real
    Data type 6: ASCII string. For each data type (except 0), there is a function to return the proper format from the binary input
      num=dtype1(b, a) (9 lines)
        num is set to the decimal equivalent of the two-byte binary number when b and a are strung together. b has the higher 8 bits and a has the lower eight bits.
      num=dtype2(b, a) (14 lines)
        num is a 2 byte signed integer. It is the same as dtype 1 except the first bit is used to determine if the number is negative. If the first bit is one, the two's compliment of the remaining bits is taken.
      num=dtype3(d,c,b,a) (18 lines)
        num is a 4 byte signed integer. The same as dtype2 but now there are 4 bytes not 2. D has the highest eight bits and a has the lowest eight bits.
      num=dtype4(d,c,b,a) (36 lines)
        num is a 4 byte real number. This number has 3 parts, the sign, the exponent and the mantissa. The first bit is the sign, the next seven bits are the exponent, and the remaining bits are the mantissa. The Calma GDSII Stream Format manual (which is hereby incorporated by reference herein) discloses information regarding this data.
      num=dtype5(h,g,f,e,d,c,b,a) (40 lines)
        num is a 8 byte real number. The sign and exponent are the first eight bits, the mantissa is now extended by 4 bytes.
      name=dtype6(data) (12 lines)
        name is the string represented by the data. Each byte in the data represents one ASCII character.
    The first step is to make sure the file has a .gds extension.
      Errorflag=my_uccas_error(fid, 1, filename) (92 lines)
        Errorflag will be a 1 if an error is detected and zero otherwise. The general form of my_uccas_error for the inputs is (num1, num2,string). Num1 is any number to do checking on and can be a scalar, vector, or matrix. Num2 is the sequential number assigned to different types of errors checked-for. These are assigned in order of thinking of the errors. String is any string to be checked.
        Errorflag will be set to 1 in this check if the program could not open the file or the file does not have a .gds extension.
      The next step is to break the binary data into records. GDSII data is stored in records. The first two bytes of each record tell how long that record is. This is used to create a data structure with a list of each record.
    The next step is to search through the records and extract the data. The third byte of each record identifies the record type. A complete list of each record type and the data formatting for each is also in the Calma GDSII Stream Format Manual. The data is put in a structure call draw, which has 8 entries, 'created', 'modified', 'name', 'boundary', 'path', 'text', 'aref', and 'sref'. This is all the information included in GDSII files. Drawings are assumed to be boundaries. There is one entry in draw for each structure in the GDSII file. Each structure in GDSII file has entries 'Boundary', 'Path', 'text', 'aref', and 'sref'. Each one of these entries in the structure has their own properties that can be found in the Calma GDSII Stream Format Manual.
  [tech, errorflag]=parse_techfile(techfile) (238 lines)
    This function sets all the technology parameters to be used. There are 8 technology variables. 1) width of material in mils, 2) carrier milling bit, 3) substrate hole milling bit, 4) microstrip GDSII layer, 5) pillar GDSII layer, 6) substrate boundary GDSII layer, 7) hole in substrate GDSII layer, and 8) the format of the output files, Gerber format of g-code format.

Tech is a vector with the technology information. Errorflag is set to 1 if there is any error. Techfile is the name of the technology file to be opened.

If no technology file is specified when running the program, it searches the current directory for a file called 'techfile.utf'. If found this file is opened. If not, all values are set to the defaults and exits. The defaults are listed in the "Design to Milling Machine Procedures" document disclosed below.

If a technology file is opened the data is read and stored in tech. The technology file is an ASCII file. The formatting of this file is also disclosed in the "Design to Milling Machine Procedures" document below herein. The function does error checking to force the proper format.

Error_flag=my_uccas_error(fid,6,techfile)

Format is the same but now it is checking to see if the command line-specified techfile could be opened errorflag=my_error_uccas(fid,7,value);

Format is the same but now it is checking to make sure the entry is valid for the techfile parameter errorflag=my_error_uccas(fid,8,value);

checks to make sure number entered for output format is in the valid range, 1 for Gerber format, 2 for g-code format.

The last step of this function is to print out what the technology values were set to.

errorflag=writedxf(data,filename.tech) (251 lines)

errorflag becomes a 1 if there is any error. Data has the structure that holds all the layout information. This structure was called draw in the parse_gds function. Filename is the name of the gds file. Tech is the vector holding the technology information the uccas process produces 5 files to be imported to the milling machine. Two of these are in a DXF format and are written here. They are in DXF format since all that is needed from these files are the coordinates of the drawn features, which is easier to do in DXF. The other files will be actual cutting bit paths, information is either in a Gerber file or G-code This function writes the DXF file necessary for the microstrip layer and the boundary layer of the substrate. The file names used are the root of the input gds file name (name with .gds removed). Then _top.dxf is added to the microstrip layer. Also, _bndry.dxf is added to the boundary file.

The function searches all data from the layout and if the layer matches the layer for the microstrip the polygon is written in DXF format to the microstrip file. If the layer matches the layer for the boundary specification, the boundary object is written in DXF format to the boundary outline file.

[pillar_data,errorfliag]=get_pillars(data,tech) (103 lines)

pillar_data is a structure of data needed to process the pillars. It has 6 entries, type (material, boundary, cut, hole, pedestal), xmin, xmax, ymin, ymax (physical locations), and handle (graphics handle to change attributes later). Errorflag is set to one if there is any type of error. Data is the information returned from parse_gds and is a list of the GDSII records. Tech is the vector containing the technology specifications.

There is error checking done in this routine errorflag=my_error_uccas(num_p.4,'')

checks to make sure there is at least a boundary layer.

errorflag=my_error_uccas(pillar,2.'')

checks to insure only one boundary exists on the outline layer. If more, there is an error.

errorflag=my_error_uccas(pillar(i),3.'')

checks to insure each entry has only four sides. This is done by checking the length of the coordinate list.

This routine first goes through all the gds records and makes a new list of type boundary of all the boundaries on the layers for the pillars, outline, and hole layers as specified in the tech vector. This is done because this structure should be small compared to the entire GDSII records, and so searching this record will be faster than searching all records.

The first entry into the pillar_data is physical location of the carrier so its locations match those of the substrate. This is material type. This depends on the width of the starting strip and the dimensions of the circuit to fit on the carrier. The $2^{nd}$ entry is the circuit boundary information, which is only used to process the entries for the material entry. The next two entries are the locations of the cut lines. These specify where the metal strip will be cut. Another function is called here.

[xmin, ymin, xmax, ymax]=find_extremes(pillar(i).coords) (22 lines)

xmin,ymin,xmax,ymax are the minimum and maximum x and y locations. Pillar.coords are the coordinate pairs for the pillar boundary. The problem is that it is unknown as to what order the coordinates are in so it is necessary to look at all coordinates to find the maxs and mins.

The function then runs through the new structure and looks for polygons on the pillar layer. For each occurrence, a new entry into the pillar_data structure is added and of type pedestal. The same is then done for the substrate holes. The pillar_data is then used to determine the carrier information.

Pillar_data=layout(pillar_data,tech); (44 lines)

Pillar_data is the structure created in the get_pillars function and tech again is the vector containing the technology information. This function creates a graphical representation of what the carrier layout will look like. Currently there is no pause in place here but a request for user input to continue can be inserted. Sets up the zoom menus in the figure.

This function is run when the zoom:window command is selected from the menu items set up in the function above. It puts the graph in zoom mode and sets it so the next mouse click is the first point of the zoom coordinates P1=Zoom_start; (4 lines)

This function stores the first point and sets up the next click of the mouse to store the last zoom point and perform the zoom function Zoom_stop(p1); (20 lines)

This function reads the stop zoom coordinate and does the zooming.

Zoom_full_view( ); (3 lines)

Restores zoom to original value

[insulation_r,insulation_p,errorflag]=insulate(pillar_data, tech); (249 lines)

Input, pillar_data is the structure created in the get_pillars function. Output, insulation_r (structure holding serpentine pattern to mill carrier pattern in a rough format), insulation_p (structure holding serpentine pattern to mill carrier pattern in a polish format), and errorflag(flag gets 1 if error, 0 if no error). First a structure of only pedestals and only holes. Then the pillars are checked, and the x locations of each pillar are put in a new structure called xs. This is done in the function below.

[pedastle.xs,errorflag]=sort_check(pedastle,data, nump,tech); (163 lines)

inputs, pedastle (structure holding pedastle data), data(structure holding all data, same as pedastle but includes boundary and material), nump(number of pedastles). Outputs, pedastle(same as input but sorted), xs(structure of the x location of every feature. These are the pedastles but it separates out the start or stop of a pedastle. Each pedastle gets two entries into this structure), errorflag (returns a 1 if an error and a zero if no error).

The first thing it does is sort the pedestals by their minimum x location.

The next thing is to do error checking on the pedestal locations. Each pedestal must be spaced from the edges and each other by the tool diameter (default is 79 mills). The pillars also must be larger than the diameter of the tool used to cut the hole to ensure a good fit. If there are any errors, the program stops and the pillars causing errors are changed color in the layout view.

Finally, it creates this structure of x locations and sorts from xmin to xmax. The xs structure has three entries, x—x location, index—which pillar it came from and is index to just pillar structure, and type—1 if it is xmin from the pillar and 2 if it is xmax from the pillar.

errorflag=hole_check(hole,data,numh,tech) (38 lines)

same format as sort_check but now it is just checking to make sure that the hole trying to cut out is not smaller than the hole cutting tool. This is not possible and will give errors later.

Now this function starts breaking the area down into boxes that will be "insulated". For this purpose, a box is an area that will be milled without the milling machine head lifting off the table. So even a straight line is called a box. It does some easy boxes first such as the initial y cut on the x boundaries through the material and the initial x cut on the y boundaries. If there are no pedestals, it makes one large box and is done. If there are pedestals, each pedestal gets a x cut along the top and bottom of each.

As it loops through all the xlocations, it manages two structures, box_c (box completed) and box_p (box in process). Box_c has all the completed boxes and box_p has boxes that have been started but not all parameters found. When the x location is a type 1 meaning the minimum x side of the pedestal, the program closes one box and opens two more. At the xlocation of type 2 meaning the maximum x side of the pedestal, the program closes two boxes and opens 1 more.

The first xlocation is obviously a type 1 and so it closes out the box that started at the x min boundary.

[box_c,box_p]=remove_box(box_c, box_p,nb) (9 lines)

this function takes the box in box_p at location specified by nb, adds it to box_c and removes it from box_p. Done once a box is closed out.

after box is closed, must open two new boxes, one above the pedaslte and one below the pedestal. The xmin is set by the current pillar, for above, know ymin, for below, know ymax. Must search to other y values. Find_max for above and find_min for below ymax=find_ymax(x, index.pedastle,m_ymax) (22 lines)

inputs, x(current x location), index(index to list of pedastle of which x on), pedastle (list of all pedastles), m_ymax(absolute maximum in y, set by boundary of carrier). Outputs, ymax (ymax that it finds). Searches all pillars and stores the index to ones that are above the current pedestal (ymin of checked pillar greater than ymax of current) and overlap the current x location(pillar xmax greater than x, pillar xmin less than or equal to x). If there are none, ymax is set to the material ymax. If multiple ones, ymax is returned as the ymin of the pillar closest to the current pillar.

ymin=find_ymin(x,index,pedastle,m_ymin); (22 lines)

same as ymax function above except it searches below the current pillar rather than above.

Now have opened two new boxes, moves to next x location. More complex after the first box is encounter.

Now we encounter the more generic case where we find an x of type 1 (starting edge) but not the first pedestal. Takes a bit more searching depending on what pedestal came before this one. Again search above and below the current pillar needed.

ymin=find_ymin_range(x-diam,x,index, pedastle.m_ymin); (24 lines)

similar to find_min but now done over a range of x values from x minus diameter of tool to the current x. This must be done due to the physical width of the milling tool. This is necessary if one box starts just beyond (under one tool diameter) the end of another box. This changes how boxes are opened and closed ymax=find_ymax_range(x-diam,x,index.pedastle, m_ymax), (24 lines)

similar to find_ymin_range but now it is looking above the pillar rather than below.

ymin=find_ymin_st(x,index,pedastle,m_ymin) (22 lines)

similar to find_ymin but now when looking at the x values of current location it checks pillar xmax greater than or equal to x and pillar xmin less than x. Just switches which side the equal is on. Needed if another pillar has same x location.

ymax=find_ymax_st(x.index.pedastle,m_ymax) (22 lines)

similar to find_ymin_st but now it is looking above the pillar rather than below.

when searching above and below, it searches three ways, ymin, ymin_range, and ymin_st. Same for ymax. The first check is ymin and ymin_range and also ymax and ymax_range. If not the same value, this means there is a pillar that ended before the current x within the tool diameter. If this is the case, the minimum x of the box has to be adjusted to the pillar above or below.

xmin=find_xmina(x-diam,x,index,pedastle) (28 lines)

inputs, x-diam (current x minus tool diameter), x (current x), index (index into pedastal list that current x belongs to), pedestal (structure of pedestals).

Outputs, xmin (xmin of new box to be formed). This is looking for the xmin of the new box to be started above the current pedestal. The only case when this happens is when a pillar ends that is completely above the current pedestal but within the tool diameter. It finds all the pillars that are above the current pillar and have an x edge within the range of the current x and the current x minus the tool diameter. It then looks for the closest pillar in the y direction and then returns the xmax of this pillar. This is the new starting x for this insulation box.

xmin=find_xminb(x-diam,x,index,pedastle) (28 lines)
        same as find_xmina except looks below pillar rather than above.

If this case is true for either below or above, then this x location does not complete a box. The reason is that when a type two is encountered and it opens up a box, if it finds a pillar ahead within the tool diameter, it extends the box it closed to cover this area. It does not complete a box but does start a box above and one below.

The previous case was a special case. For the other case when ymin and ymin_range and ymax and ymax_range are the same value, one box is completed and two new boxes are opened. The y values for the new boxes are set by the current pillar and the material boundary. Searching has to be done to close out one box.

[box_c,box_p,nb]=find_box(box_c, box_p,nb, ymax−radius,ymin+radius, x-radius, type) (56 lines)
        outputs box_c (list of completed boxes), box_p(boxes in process), nb (number of boxes in process). Inputs, box_c, box_p, nb, ymax-radius (ymax of one box in process), ymin+radius(ymin of one box in process), x-radius (x value to close out box with), type (type of x working on). This function looks at the boxes in progress and matches the ones with the y values of the one to close. It does some checking to make sure there are no duplicate boxes, which can happen but I don't remember where. Once the box with the same y values are found in box_p, the xmax is assigned and moved to box_c. The entry is then removed from box_p.

So far we have only considered an x location that is type 1 or a starting x of a pillar. Now we need to do the same for the type 2 pillars. Type two is just opposite from one in that finding a 2 closes two boxes and opens one box. The first special case is the last pillar. It can close out one on top and one on bottom. The y values are known since it is the last box. It also then makes the final box which is the last area until the end of the piece. It uses search functions described above.

The more common case is when a type 2 x is reached but it is not the last one. The first step is to close the box above. It searches for the ymax above with find_ymax_st and then finds ymax over the range of the current x to the diameter of the tool. This is looking for the special case when the next pedestal is within a tool width of the end of the current pedestal. If this is the case, the closed box is at the beginning of the next pedestal.

xmax=find_xmaxa(x, x+diam, index,pedastle); (27 lines)
        same as find_xmina but now it is looking for a maximum value rather than a minimum value
    xmax=find_xmaxb(x, x+diam, index.pedastle); (27 lines)
        same as find_xmaxa but below the pedastal; if the next pillar was a starting x and within the tool diameter, the above functions were used to find the xmax and then uses find_box to close out that box. If the next pillar is not in this class, the xmax is known as the current x and find_box is used to close out the box.

The next step is to open up a new box. There are three cases. The first is if there is a pillar with the same x max above or below the current box. If this is the case, then the box is not limited by the pillar above and below. This lends itself to a case where duplicate boxes will be made, but this is fixed later.

The $2^{nd}$ case is if there is no x location within a tool diameter and a new processed box is opened. The third case is a special case if the next x is a start x and it is exactly a tool diameter away. Then a vertical line is made and the box is closed. Now all the box processing is done Now that all the boxes are done, there is a function to help debug the box making process Draw_box(box) (9 lines)
        Takes the structure of boxes and draws them in the layout area
        the data is also redrawn since the boxes cover up the pillars.
        The boxes are defined for the center of tool so they are shrunk by a tool radius all the way around. This could be fixed easily to make it look better.

Draw_box2(box) (12 lines)
        Takes the structure of boxes and draws them in the layout area
        the data is also redrawn since the boxes cover up the pillars.
        The boxes are defined for the edge of the cutting tool. This box now shows the extent of where the tool will be working Draw_box3(box) (9 lines)
        Takes the structure of boxes and draws them in the layout area
        the data is also redrawn since the boxes cover up the pillars.
        The boxes are now shown as filled areas, used to document the process in good looking figures insulation_r=insulate_box rough(box, tech); (109 lines)
    inputs, box(structure of boxes x and y locations) and tech which has technology parameters. Output, insulation_r (structure that has all the x and y pairs of where the tool will move to insulate each box. This structure has three entries, type—all get assigned serpentine, num_verticies—number of xy pairs of the tool path, and verticies—xy pairs of tool path. This function goes through each box and writes the x and y pairs for how the tool will move to clear out each box. It only moves one half of the tool diameter for each next pass to help the tool lifetime. This is called a rough cut.

insulation_p=insulate_box_polish(box,tech); (126 lines)
    inputs, box(structure of boxes x and y locations) and tech which has technology parameters. Output, insulation_r (structure that has all the x and y pairs of where the tool will move to insulate each box. This structure has three entries, type—all get assigned serpentine, num_verticies—number of xy pairs of the tool path, and verticies—xy pairs of tool path. This function goes through each box and writes the x and y pairs for how the tool will move to clear out each box. It now moves only 5 mils in each pass and does a climb cut each time. This is to make the surface smooth.

layout_serp(insulation): (29 lines)
    This function draws the patters of the insulation paths. It draws a blue region around the total carrier. This is a visual of what insulate_box_rough just finished doing.
    circle(center,r,points,color) (10 lines)
        draws a circle centered at center with radius r. Also defines the number of segments to use and the color.
writegerber(insulation.pillar_data,filename,tech); (153 lines)
    inputs, insulation (structure of insulation x and y locations), pillar_data (structure holding original pillar information), filename, (name of input file) and tech holding technology information.
    This function creates three text files with the same file name but adds the extensions ins "_ins", "_cut", "_hole". These files are all in the format of gerberx so they can be read by circuit cam.
    _ins has information for the insulation regions
    _cut has cutting information
    _hole has information for where holes need to be cut in the substrate to fit the pillars and where holes were defined to be cut in the substrate.
write_carrier_files(insulation_r.insulation_p,data,filename,tech) (269 lines)
    inputs, insulation_r (structure of insulation x and y locations for rough cut), insulation_p (structure of insulation x and y locations for polish cut), data (structure holding original pillar information), filename, (name of input file) and tech holding technology information.
    This function creates 4 text files. "hole.gbr", "cut.txt", "rough.txt", "polish.txt". hole.gbr has information for where holes need to be cut in the substrate to fit the pillars and where holes were defined to be cut in the substrate. cut.txt is a file to cut out the carrier in G-code. This code is a CNC milling machine format. rough.txt is the G-code for the rough milling pattern. polish.txt is the G-code for the polish milling pattern.

(Total Lines: 2745)

The following Table 1 repeats significant portions of the preceding function call material in outline form.

TABLE 1

| This file identifies the functions called in the UCCAS Program. | | | | number of lines |
|---|---|---|---|---|
| UCASS | | | | 71 |
| parse_gds | | | | 287 |
| | my_error_uccas | | | 92 |
| | dtype1 | | | 9 |
| | dtype2 | | | 14 |
| | dtype3 | | | 18 |
| | dtype4 | | | 36 |
| | dtype5 | | | 40 |
| | dtype6 | | | 12 |
| parse_techfile | | | | 238 |
| | my_error_uccas | | | |
| writedxf | | | | 251 |
| get_pillars | | | | 103 |
| | my_error_uccas | | | |
| | find_extremes | | | 22 |
| layout | | | | 44 |
| | zoom_uccas | | | 7 |
| | zoom_start | | | 4 |
| | zoom_start | | | 20 |
| | zoom_full_view | | | 3 |

TABLE 1-continued

| This file identifies the functions called in the UCCAS Program. | | number of lines |
|---|---|---|
| insulate | | 249 |
| | sort_check | 163 |
| | hole_check | 38 |
| | remove_box | 9 |
| | find_ymax | 20 |
| | find_ymin | 20 |
| | find_ymin_range | 24 |
| | find_ymax_range | 24 |
| | find_ymax_st | 22 |
| | find_ymin_st | 22 |
| | find_xmina | 28 |
| | find_xminb | 28 |
| | find_box | 56 |
| | find_xmaxa | 27 |
| | find_xmaxb | 27 |
| | draw_box | 9 |
| | draw_box2 | 12 |
| | draw_box3 | 9 |
| | insulate_box_rough | 109 |
| | insulate_box_polish | 126 |
| | layout_serp | 20 |
| | circle | 10 |
| writegerber | | 153 |
| write_carrier_files | | 269 |
| total number lines of code | | 2745 |

Design to Milling Machine Procedure

The following paragraphs recite a detailed step by step sequence usable by for example a technical person new to the environment of the present invention in applying the UCCAS specialized software disclosed on the compact disc appended to the present document along with several commercially available software packages, identified in these paragraphs and elsewhere in the present specification, to achieving a mating substrate and substrate carrier pair according to the present invention. As will become apparent in this procedure detailed steps including software mouse click instructions are provided. The procedures described here provide files usable with the above-identified LPKF milling machine.

Figure 32:
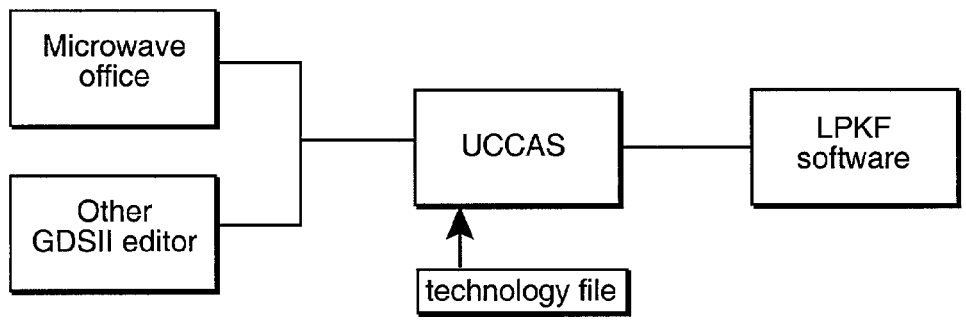
FIG. 32 shows a software flow diagram in block form.

Input communication with the UCCAS specialized software disclosed on the compact disc appended to the present document requires input data organized according to the GDSII format, i.e., the format commonly used in the integrated circuit art for communicating circuit layout drawing data and integrated circuit mask drawing data to circuit fabricating equipment. Microwave Office is a commercially available software package provided for the purpose of generating schematic drawings and layout drawings of the circuit being fabricated. The software flow diagram of FIG. 32 in the drawings shows the use of Microwave Office as one possible way of generating GDSII file data; other GDSII editors may be used. The input editor for the LPKF milling machine is identified by the name "Circuit Cam".

By way of disclosing each of these software packages in a manner believed to make the present invention practicable, the UCCAS specialized software spoken of herein is fully disclosed in the UCCAS code folder in MATLAB format located on the compact disc appended to the present document. This compact disc also includes example input files including GDSII files and a technology file in the UCCAS_examples folder. Additional information concerning the MATLAB format may be obtained from publications by The MathWorks Inc. of 3 Apple Hill Drive, Natick, Mass. 01760-2098; WWW.mathworks.com. Additional information concerning the GDSII format may be obtained from a document titled "GDSII™ Stream Format Manual", Document # B97E060 published by The CALMA Corporation, a General Electric Company subsidiary, release 6.0 or later. Information regarding the GDSII format is also available in the appendix of a textbook "Computer Aids for VLSI Design" by Steven M. Rubin, Addison-Wesley VLSI Systems Series. The Rubin text is said to be out of print as of 1993 but published on the World Wide Web in 1997; one such publication has been found at the address http://WWW.rulabinsky.com/cavd/index.html as of the time of filing the present document.

In a similar manner information regarding the Microwave Office software identified herein and utilized in the present procedure is available from Applied Wave Research, Inc. of 1960 East Grand Avenue, Suite 530, El Segundo, Calif.; www.mwoffice.com. Information regarding the Circuit Cam software identified herein and utilized in the present procedure is available from LPKF Laser and Electronics AG, Osteriede 7, 30827 Garbsen, Germany or LPKF Laser and Electronics, 28220 Boberg Road, Wilsonville Oreg., 97070; www.lpkfusa.com; this is the same company and same location identified above herein with respect to the preferred milling machine.

The following procedure is organized in the form of an outline having four numbered major steps each of which includes a layered hierarchy of sub steps that is up to four levels deep. In this outline the symbol [ ] designate a menu selection, colons (:) are used to separate the menu hierarchy and quotation marks (" ") designate exact writing in a software tool.

1) Create GDSII file
   a) Generic Layout Tool
      i) Layout can be created in any program that can export GDSII format of data
      ii) Layout must have one layer defining the outline of the circuit(default layer is 1 in the UCCAS program)
         (1) Error will occur if more than one polygon on this layer
      iii) Only allowed to specify one layer for metal pattern (default layer is 2 in program)
         (1) Software inoperative if more than one layer is used
      iv) Do not need to specify pillar information if they are not necessary (default pillar layer is 5)
      v) Holes in the substrate can be drawn, currently limited to four sided geometry (default hole layer is 3)
      vi) Not allowed to export a design with a hierarchy. Everything must be flattened.
      vii) Data type on layers does not matter
   b) Microwave Office (if using the hybrid layout process file, this list of steps will be the most detailed of all descriptions)
      i) Import layout process file
         (1) Select [Options:Import Process Definitions]
         (2) Find file called "hybrid.1pf"
      ii) Create layout from schematic
         (1) Make schematic the top window by having it open and selected last
         (2) Select [Schematic:View Layout]
         (3) Click layout tab on the lower left corner of the design window to obtain layout tools.
      iii) Finalize placement of microstrip elements
         (1) Move microstrip elements in layout so spacings are correct
         (2) Left clicking on the element and dragging can move elements.
      iv) Add boundary layer to layout
         (1) Left click on the square box next to "Board_outline" in the Drawing Layers window
         (2) Left click on the rectangle on the top tool bar
         (3) Click and drag to draw the board outline layer
         (4) Adjust outline to be the proper size of the finished piece
         (5) Note: only one rectangle allowed on this layer
      v) Add pillars to layout
         (1) Left click on the square box next to "Pillar" in the Drawing Layers window
         (2) Left click on the rectangle on the top tool bar
         (3) Click and drag to draw the pillars
         (4) Adjust pillars to be the proper size, considering the three notes below
         (5) Note 1: Holes are cut 2 mils larger on each side of the pillars to assure fitting. If the pillar is 20×20, the hole will be 24×24. Therefore, a pillar should not be placed closer than 2 mils to any microstrip or the microstrip will be cut during the milling process
         (6) Note 2: With the pillars, it is necessary to fit a rectangle into a hole with rounded corners. Therefore, the way the program works is that one orientation (x or y) of the pillar will be closer to the edge of the hole than the other. The program determines which is longer (x or y) and makes that edge closest to the edge of the hole. This is important if you are placing a device and you want to minimize bond wires. If the line is running in the x direction (therefore the end of the line is parallel to the y direction), make the pillar such that the length in the y direction is longer than the x direction. This will put the pillar as close as possible to the edge of the microstrip.
         (7) Note 3: The pillars must be spaced by the cutting tool diameter (default is 79 mils) and spaced from the top and bottom boundary by this spacing. If there is an error, this will be found later in the process. I would recommend checking this in the layout tool to save yourself some work.
      vi) Add any additional holes needed in the substrate (i.e., holes not having mating pillars)
         (1) Left click on the square box next to "Substate_hole" in the Drawing Layers window
         (2) Left click on the rectangle on the top tool bar
         (3) Click and drag to draw the holes
         (4) Adjust holes to be the proper size
         (5) Notes 1 and 2 above apply to the holes
      vii) Export layout GDSII file
         (1) Make the layout view the top view by selecting the layout window
         (2) Select {Layout:export layout}
         (3) Enter desired filename and destination
         (4) Select "GDSII (GDSII Flat, *.gds)" from the "save as type" box
         (5) Actuate the save button
2) Make Substrate and Carrier Files for Circuit Cam Software
   a) Copy of UCCAS program in MATLAB needed on computer.

b) Set the MATLAB path to include the location of the UCASS program
c) Start MATLAB and change to the directory where the GDSII file is located.
d) Run the UCCAS program, three options discussed below
   i) To use all the default process information (carrier material width 1000 mils), layer numbers (outline=1, microstrip=2, pillar=5), milling bits (carrier milling=79 mils, hole cutting in substrate=20 mils), and a G-code file (format type 1, gerber format type is type 2) there is no need for a "technology file".
      (1) Type "uccas('filename')" at command line
      (2) Filename must have a .gds extension and be a flat GDSII file
      (3) Note, if there exists a file called 'techfile.utf' in the same file as the GDSII file, the program will attempt to use this file as the technology file.
   ii) To change the default process information, create a new techfile, this can be done in two ways, the first is to create a new file containing the technology file information in the proper format. The format is discussed in appendix A of this procedure.
      (1) Type "uccas('filename','techfile')" at command line
      (2) Filename must have a .gds extension and be a GDSII file
      (3) Techfile can have any extension but must be in the specific format
   iii) To change defaults another way, have the technology file in the same directory as the GDSII file and identified as 'techfile.utf'. The program will load the values from this file for this option
      (1) Type "uccas('filename')" at command line
      (2) Filename must have a .gds extension and be a flat GDSII file
      (3) 'techfile.utf' will be loaded by the program as the technology file
e) Note that this program operates even if the design was in microns, it will convert to mils
f) The program will show any errors, if no errors exist, carrier and the insulation paths used by "circuit cam" software will appear.
g) Five new files will be created with the root of the name coming from the name of the structure in the GDSII file (in Microwave office, this is the name of the schematic) if the carrier files will be formatted for the LPKF milling machine (Gerber output files)
   i) Assume "yyy" was the structure in the GDSII file
   ii) "yyy_ins.gbr"—Gerber file holding the insulation data for the carrier
   iii) "yyy_cut.gbr"—Gerber file holding the cut ting data for the carrier
   iv) "yyy_hole.gbr"—Gerber file holding the locations of the holes to be cut in the substrate to accommodate the carrier pillars
   v) "yyy_bndry.dxf"—dxf file for the boundary layer for the substrate
   vi) "yyy_top.dxf"—dxf file for the microstrip layer for the substrate
h) six new files will be created if the carrier files will be formatted for G-code output files
   i) "boundary. dxf"—dxf file for the boundary layer for the substrate
   ii) "top_metal.dxf"—dxf file for the microstrip layer for the substrate
   iii) "hole.gbr"—Gerber file for cutting holes in the substrate
   iv) "rough.txt"—g-code file that has the CNC commands to perform the rough milling
   v) "polish.txt"—g-code file that has the CNC commands to perform the polish milling
   vi) "cut.txt"—g-code file that has the CNC commands to perform the cutting
   i) If any errors, you must go back to step 1 and modify the layers
3) Make Circuit Cam Files
   a) Start Circuit Cam software
   b) For the Substrate
      i) Import top layer (files need to be recognized as dxf files in circuit cam, open them with word pad and save them as something else, preferably with a short name if not so recognized)
         (1) Click [File:Import]
         (2) Find "yyy_top.dxf" or "top_metal.dxf" file and double click
         (3) In layer field, set to "top layer" and hit "import"
         (4) Must change imported data to boundaries
            (a) Click [Select:All]
            (b) Click [Edit:Curve:Combine], shortcut is (Control B)
            (c) Click [Edit:Diverse:Path to Polygon], shortcut (Shift P)
      ii) Import boundary layer
         (1) Click [File:Import]
         (2) Find "yyy_bndry.dxf" or "boundary.dxf" file and double click
         (3) In layer field, set to "Rubout Top" and hit "import"
         (4) No need to convert this layer like the top layer
      iii) Perform Insulation
         (1) Click [Edit:Insulate]
         (2) Chose tools desired for the top layer
         (3) Select "Run"
      iv) Import holes for pillars
         (1) Click [File:Import]
         (2) Find "yyy_hole.gbr" or "hole.gbr" file and double click
         (3) In layer field, set to "Insulate Bottom" and elect "import"
         (4) No need to convert this layer like the top layer
      v) Create Cutting Definition
         (1) Click [Edit:Contour Routing]
         (2) Select following options
            (a) Outside
            (b) Layer and set layer to "Rubout Top"
            (c) Destination layer is "Cutting Outside"
            (d) Used Tool List is "LPKF Cutting Tools"
            (e) Tool is "Contour Router 1.0 mm" (typical but not necessary)
            (f) Gap Width is 39 mils
         (3) Select Run
         (4) Make Break out tab (only if using tape to hold piece, not necessary if using spray adhesive)
            (a) Select cut outline shown in the layout
            (b) Use + and − keys to move * around the cut definition until the * is where the break out tab is desired
            (c) Select button on top buttons called "Breakout Tab"
      vi) Save file (name "substrate" may be used)
      vii) Export the file to Board Master (actuate the button that looks like the milling machine)

c) For the Carrier(only if using the LPKF milling machine)
  i) Open a new window
  ii) Import insulation regions
    (1) Click [File:Import]
    (2) Find "yyy_ins.gbr" file and double click
    (3) In layer field, set to "Insulate Top" and elect "import"
  iii) Import cut regions
    (1) Click [File:Import]
    (2) Find "yyy_cut.gbr" file and double click
    (3) In layer field, set to "Cutting Outside" and elect "import"
  iv) Save file (name "carrier" may be used)
  v) Change export settings
    (1) Click [Config:Job Configurations:Export Settings]
    (2) Double left click on "LPKFCircuitBoardPlotter"
    (3) Right click on "insulate top"
    (4) Click button that says "+x" for the direction
    (5) Click "Close" on the top of the window
  vi) Save again
  vii) Export file to Board Master
4) Take Files to the Milling Machine
  a) Take the generated files to the milling machine computer using a floppy disc or network
  b) Trained milling machine operator desirable
  c) Notes
    i) Cutting holes in the substrate is accomplished with a 20 mil end mill, this can be changed
    ii) Milling and cutting the carrier is done with a 79 mil end mill, this also can be changed but the success of using a smaller bit is minimal
    iii) The Insulate bottom phase must be changed from reversible to non-reversible to make the holes line up Design to Milling Machine Procedure Appendix A
Technology File Format The technology file allows the user to specify the parameters for the Unified Custom Carrier And Substrate (UC-CAS) process. Eight parameters can be specified for this process. They are listed below with the proper name for the technology file and the default value. The default values are used unless changed by this file.

| Name | Description | Default value |
| --- | --- | --- |
| Material | Width of metal strip to be used to make carrier in mils | 1000 |
| Carrier_bit | Milling bit size to mill carrier metal in mils | 79 |
| Hole_bit | Milling bit size to cut holes in substrate to fit pillars in mils | 20 |
| Microstrip_layer | GDSII layer containing the microstrip information | 2 |
| Pillar_layer | GDSII layer containing the pillar information | 5 |
| Boundary_layer | GDSII layer containing the substrate outline information | 1 |
| Substrate_hole_layer | GDSII layer containing the substrate hole information | 3 |
| Format | Formatting of output files, 1 for Gcode, 2 for Gerber | |

The format for the file is that the name is on a line and then the value must be on the very next line.

% and ! can be used to identify comments. They cannot be used between the name and the value specified but can be used on the same line as a value as long as one space between value and first typing.
Any order is allowed.
Value must come on line after specification
Can include as many of the 8 as desired. Any name not included will be set to the default value.
Capitalization does not matter.
Extension of the file does not matter unless the program is to open the file in the current directory, then file must be called "techfile.utf".

EXAMPLES

Example 1

Change all process parameters. The carrier will be 2 inches wide, microstrip is on layer 7, boundary is on layer 20, pillars are on layer 9, substrate holes on layer 25, a 129 mil bit used to mill the carrier, a 10 mil bit to cut out holes, and formatted for G-code output. The technology file appears as follows:
% material sets the width of the metal to be used in the process
Material
2000
% this layer has the GDSII layer that the microstrip was drawn on
microstrip_layer
7
% this layer has the GDSII layer the boundary s were drawn on
boundary_layer
20
% this layer has the GDSII layer the pillars were drawn on
pillar_layer
9
% this layer has the GDSII layer the substrate holes were drawn on
hole_layer
25
% this is the size of the bit used on the LPKF machine to mill the carrier
carrier_bit
129
% this is the size of the bit used on the LPKF machine to cut a hole in the substrate hole_bit
10
% this line determines how the carrier files are written, 1 for Gerber, 2 for G-code format
1

Example 2

Use all default parameters but change the width of the carrier to 3 inches. The technology file appears as follows:
Material
3000

Example 3

Use the default material and milling bits but the data is on different GDSII layers. Microstrip is on layer 54, pillars are on layer 19, and the boundary is on layer 23. The technology file appears as follows:
% top metal (microstrip) layer
microstrip_layer 54
!raised metal areas (pillars) layer
pillar$^{layer}$
19
!circuit outline (boundary) layer
bounary_layer
23

Figure 29:
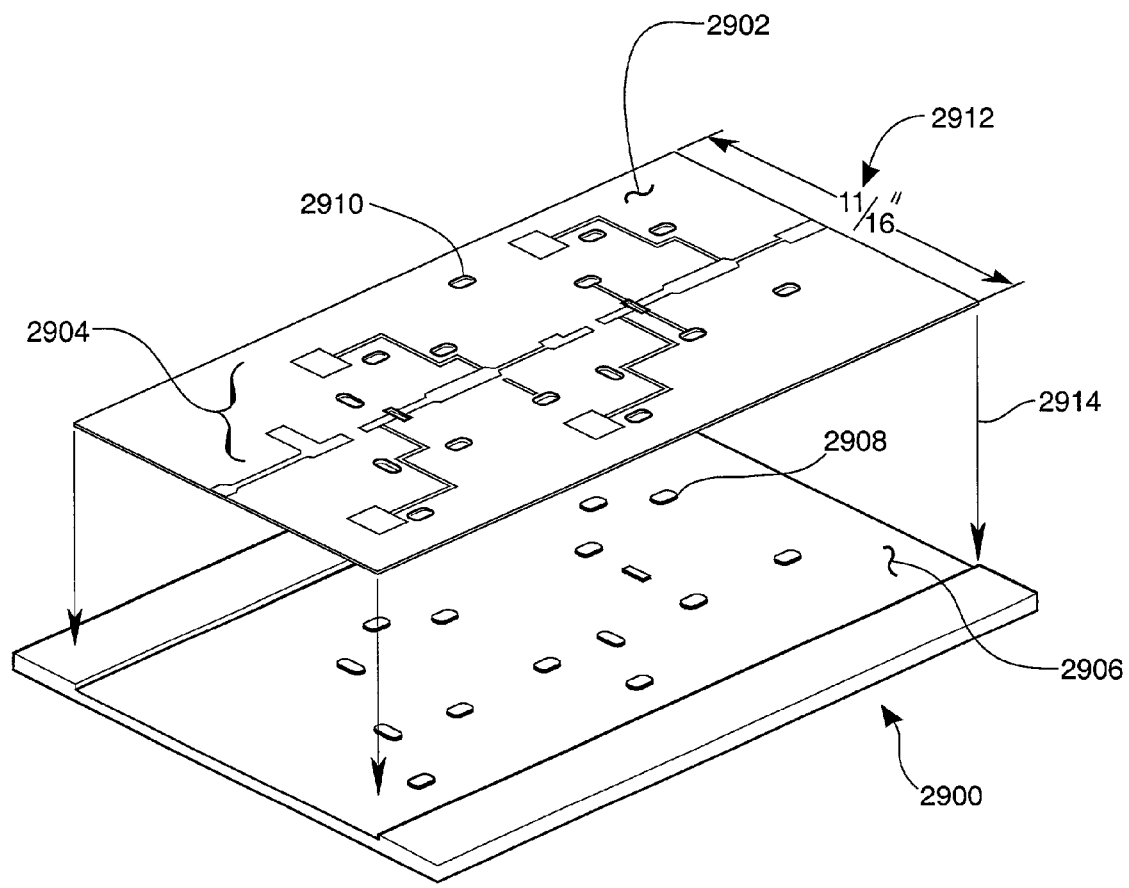
FIG. 29 shows an exploded view of a hybrid circuit device made in accordance with the present invention.

FIG. 29 in the drawings shows an exploded perspective view of a 15-via hybrid device made in accordance with the present invention. The FIG. 29 device includes a substrate carrier 2900, a substrate 2902 and an array 2904 of network elements embodied in the form of shaped conductors located on the substrate 2902 surface. FIG. 29 also shows the mating recess 2906 in the substrate carrier 2900 and a plurality of recess-received pillars such as the pillar 2908. Notably the hole 2910 in the substrate 2902 is reserved for substrate topside component use and does not have a mating pillar in the recess 2906. A representative dimension for the substrate 2902, expressed in fractional inch units, appears at 2912 in FIG. 29; smaller or larger substrates are of course possible within the scope of the invention. A representative arrow indicating the exploded nature of the FIG. 29 view and the intended final disposition of the substrate 2902 appears at 2914 in the FIG. 29 drawing. The substrate 2902 may be made of a machineable radio frequency dielectric material such as one of the materials available from Rogers Corporation of One Technology Drive, PO Box 188, Rogers Conn., 06263-0188; http://www.rogers-corp.com/.

Figure 30A:
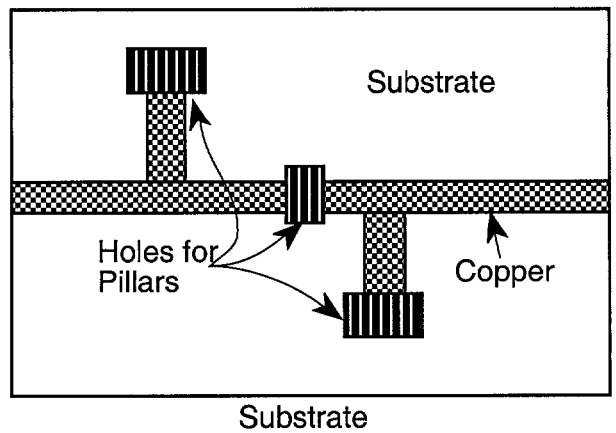
FIG. 30A shows a top view of a substrate having pillar holes according to the present invention.
Figure 30B:
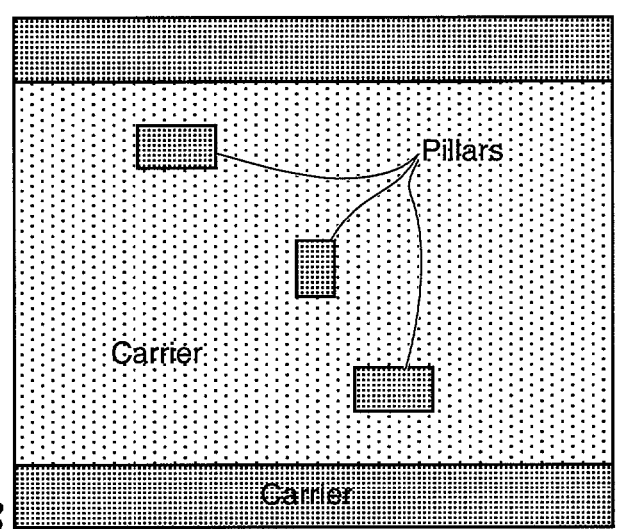
FIG. 30B shows a top view of a mating substrate carrier for the FIG. 30A substrate.
Figure 30C:
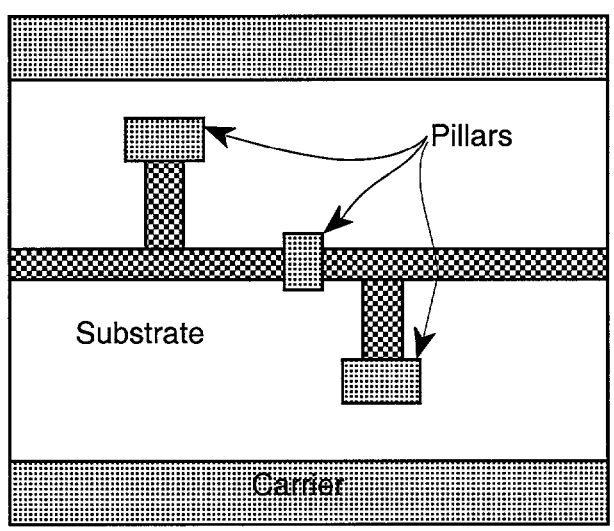
FIG. 30C shows the substrate of FIG. 30A and the substrate carrier of FIG. 30B in a mated, assembled state.

The three views of FIG. 30 in the drawings show top views of a substrate made in accordance with the present invention, a mating substrate carrier for this substrate and the assembled substrate and substrate carrier in the respective views of FIG. 30A, FIG. 30B and FIG. 30C.

Figure 31A:
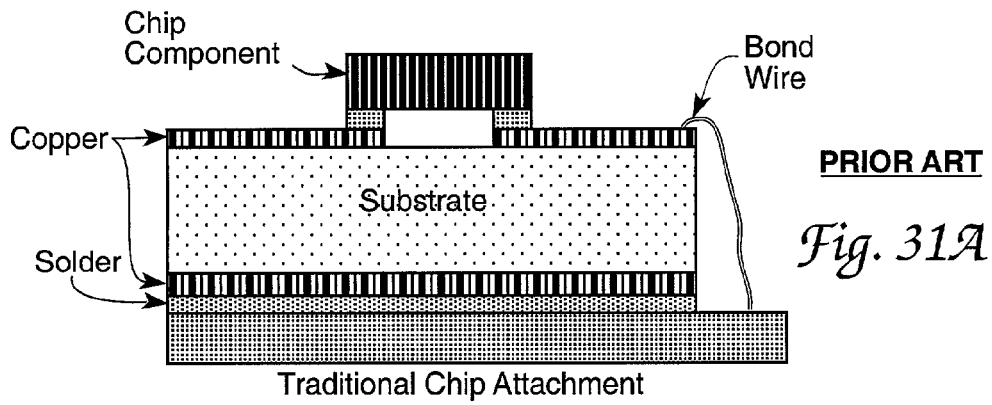
FIG. 31A shows a prior art grounding arrangement for a representative hybrid component in cross section.
Figure 31B:
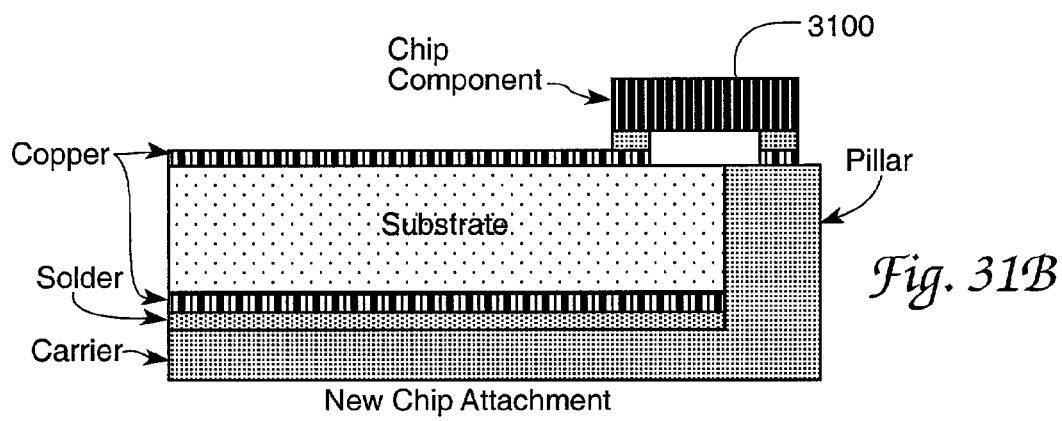
FIG. 31B shows a grounding arrangement for a representative hybrid component according to the present invention in cross section.

FIG. 31 in the drawings shows a comparison of a traditional integrated circuit die attachment and grounding bond wire, FIG. 30A, with the same elements achieved in the manner of the present invention, FIG. 30B. The chip component or integrated circuit die shown at 3100 in FIG. 31 may also be attached to a pedestal portion of the carrier 3102 when needed according to the invention.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. Computer aided, low grounding impedance and efficient-cooling method of disposing a substrate-received hybrid electronic circuit device on a device-supporting metallic carrier member, said method comprising the steps of:
   segregating a selected length of metallic carrier member stock from an extended length of said stock;
   defining in computer code an array of milling machine cutter paths extending across an upper surface of said selected length of metallic carrier member stock, from an open end of a carrier recess well to be milled in said metallic carrier member upper surface;
   said defining in computer code the array of milling machine cutter paths including a plurality of milling machine cutter operation-free upstanding metallic carrier member pillar regions selectively disposed across a bottom surface of said recess well in response to pillar region-defining coding in said computer code;
   machining said recess well, with recess well remainder areas comprising said upstanding pillar regions, into said metallic carrier member stock using lateral movements of said milling machine cutter controlled by said computer code;
   fabricating a carrier recess well-conforming, conductor-clad, electrically insulating, hybrid electrical circuit device substrate member from a blank of said substrate member stock using a milling machine also controlled by the computer code;
   said fabricated hybrid electrical circuit device substrate member including substrate-piercing hole members disposed therein in clad conductor locations registered with said metallic carrier member pillar regions; and
   attaching said hybrid electrical circuit device substrate member to said metallic carrier member within said carrier recess well using heat responsive electrically conductive attachment material;
   said attaching step including forming attachment material bonds between said clad conductor and said upstanding metallic carrier member pillar regions at said substrate-piercing hole members.

2. The computer aided, low grounding impedance and efficient-cooling method of disposing a substrate-received hybrid electronic circuit device on a device-supporting metallic carrier member of claim 1 wherein said step of machining said recess well includes milling machine cutter lateral cutting engagement with said metallic carrier member stock.

3. The computer aided, low grounding impedance and efficient-cooling method of disposing a substrate-received hybrid electronic circuit device on a device-supporting metallic carrier member of claim 1 wherein said milling machine cutter control computer code includes a special case algorithm supporting cutter machining in pillar separation spaces smaller than a nominal cutter diameter.

4. The computer aided, low grounding impedance and efficient-cooling method of disposing a substrate-received hybrid electronic circuit device on a device-supporting metallic carrier member of claim 1 wherein said step of fabricating a carrier recess well-conforming, conductor-clad, electrically insulating, hybrid electrical circuit device substrate member from a blank of said substrate member stock includes milling machine cutter operation on a substrate member upper surface conductor comprising a microwave electronic circuit and milling machine cutter operation through a lower ground plane conductor.

5. The computer aided, low grounding impedance and efficient-cooling method of disposing a substrate-received hybrid electronic circuit device on a device-supporting metallic carrier member of claim 1 wherein said fabricated hybrid electrical circuit device substrate member further includes additional substrate-piercing hole members disposed in clad conductor locations non registered with said metallic carrier member pillar regions.

6. The computer aided, low grounding impedance and efficient-cooling method of disposing a substrate-received hybrid electronic circuit device on a device-supporting metallic carrier member of claim 1 wherein said step of defining in computer code an array of milling machine cutter paths extending across an upper surface of said selected length of metallic carrier member stock, from an open end of a carrier recess well to be milled in said metallic carrier member upper surface includes defining a sequence of orthogonally disposed milling machine cutter movement paths.

7. The computer aided, low grounding impedance and efficient-cooling method of disposing a substrate-received hybrid electronic circuit device on a device-supporting metallic carrier member of claim 1 wherein said step of defining in computer code an array of milling machine cutter paths extending across an upper surface of said selected length of metallic carrier member stock, from an open end of a carrier recess well to be milled in said metallic carrier member upper surface, includes defining in computer code a pedestal member region larger in physical size than said carrier member pillar regions.

8. The computer aided, low grounding impedance and efficient-cooling method of disposing a substrate-received hybrid electronic circuit device on a device-supporting metallic carrier member of claim 1 wherein said step of machining includes cutting a substrate-receiving recess in said supporting metallic carrier member using a computer algorithm guided milling machine cutter bit.

9. The computer aided, low grounding impedance and efficient-cooling method of disposing a substrate-received hybrid electronic circuit device on a device-supporting metallic carrier member of claim 1 wherein:
  said step of fabricating a hybrid electrical circuit device substrate member includes disposing a plurality of thickness-traversing apertures in precisely defined, lateral locations of said substrate member and disposing a shaped additional larger aperture in a precisely defined, lateral location of said substrate member; and
  said machining step also includes leaving an upstanding carrier metal-comprised pillar member, disposed in registration with said shaped additional larger substrate member aperture, on a floor portion of said metallic carrier member; and further including the step of locating an electronic circuit die member on an upper surface of said upstanding carrier member metal-comprised pillar member within said substrate shaped additional larger aperture.

10. The computer aided, low grounding impedance and efficient-cooling method of disposing a substrate-received hybrid electronic circuit device on a device-supporting metallic carrier member of claim 1 further including the step of connecting circuit nodes of said pillar-mounted electronic circuit die member with circuit nodes of said substrate-received hybrid electrical circuit device substrate member using bond wire jumper conductors.

11. The computer aided, low grounding impedance and efficient-cooling method of disposing a substrate-received hybrid electronic circuit device on a device-supporting metallic carrier member of claim 1 wherein said attaching step forming of attachment material bonds between said clad conductor and said upstanding metallic carrier member pillar regions at said substrate-piercing hole members includes use of one of a conductive epoxy adhesive material, indium solder material and tin-lead solder material.

12. The computer aided, low grounding impedance and efficient-cooling method of disposing a substrate-received hybrid electronic circuit device on a device-supporting metallic carrier member of claim 1 wherein said pillar region-defining coding in said computer code and said defining step computer code are located in a same computer code file.

13. The computer aided, low grounding impedance and efficient-cooling method of disposing a substrate-received hybrid electronic circuit device on a device-supporting metallic carrier member of claim 1 wherein said fabricating step conductor-cladding includes a ground plane element conductor having a computer code determined metallic carrier member pillar region receiving aperture disposed therein.

* * * * *